(12) United States Patent
Chaudhari et al.

(10) Patent No.: US 11,158,292 B2
(45) Date of Patent: Oct. 26, 2021

(54) METHOD AND APPARATUS FOR DYNAMICALLY CHANGING DISPLAY CLOCK FREQUENCY

(71) Applicant: Intel Corporation, Santa Clara, CA (US)

(72) Inventors: Prashant Chaudhari, Folsom, CA (US); Arthur Runyan, Folsom, CA (US); Michael Derr, El Dorado Hills, CA (US); Jonathan Oder, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/752,427

(22) Filed: Jan. 24, 2020

(65) Prior Publication Data

US 2021/0233501 A1    Jul. 29, 2021

(51) Int. Cl.
| | |
|---|---|
| *G09G 5/391* | (2006.01) |
| *G09G 5/36* | (2006.01) |
| *G06F 1/08* | (2006.01) |
| *H03C 3/09* | (2006.01) |
| *H03L 7/07* | (2006.01) |

(52) U.S. Cl.
CPC .............. *G09G 5/391* (2013.01); *G06F 1/08* (2013.01); *G09G 5/363* (2013.01); *G09G 2310/08* (2013.01); *G09G 2340/0435* (2013.01); *G09G 2370/12* (2013.01); *H03C 3/0966* (2013.01); *H03L 7/07* (2013.01)

(58) Field of Classification Search
CPC .......... G09G 5/391; G09G 5/006; G09G 5/12; G09G 5/18; G09G 5/008; G09G 5/003; G09G 5/005; G09G 2310/08; G09G 2370/12; G09G 2370/22; G09G 2370/042; G09G 5/363; G09G 2340/04–0435; G06F 1/08; H03C 3/0966; H03L 7/07; H03L 7/0996; H03L 7/1976; H03L 7/1972; H03L 7/0802; H03L 7/0805; H03L 2207/06; H04N 21/6373; H04N 5/04

See application file for complete search history.

(56) References Cited

U.S. PATENT DOCUMENTS

| | | |
|---|---|---|
| 6,678,834 B1 | 1/2004 | Furuichi et al. |
| 2007/0139425 A1* | 6/2007 | Neuman ............ H04N 21/4316 345/520 |

(Continued)

OTHER PUBLICATIONS

Extended European Search Report from European Patent Application No. 20198529.8 dated Mar. 29, 2021, 7 pgs.

*Primary Examiner* — Xuemei Zheng
(74) *Attorney, Agent, or Firm* — Schabe, Williamson & Wyatt, P.C.

(57) ABSTRACT

Upon external display configuration change, a graphics display driver or any suitable hardware or software modifies the clock frequency of the processor core (e.g., graphics processor core) display engine. The graphics display driver or any suitable hardware or software reprograms the core display clock PLL (CDCLK PLL) to a new frequency, without any dead clocks during such frequency change. A divide-by-2 divider changes the frequency of the PLL on the fly or dynamically. The technique may not require the PLL to be turned off and turned back again at all.

21 Claims, 16 Drawing Sheets

(56) References Cited

U.S. PATENT DOCUMENTS

| | | | |
|---|---|---|---|
| 2016/0013928 A1* | 1/2016 | Tsuiji | H04L 7/0331 |
| | | | 375/362 |
| 2018/0191996 A1* | 7/2018 | Malemezian | G06F 3/1423 |
| 2019/0220054 A1 | 7/2019 | Musunuri et al. | |
| 2019/0303083 A1* | 10/2019 | Shekhar | G06F 3/1423 |
| 2020/0312271 A1 | 10/2020 | Derr et al. | |

* cited by examiner

METHOD AND APPARATUS FOR DYNAMICALLY CHANGING DISPLAY CLOCK FREQUENCY

BACKGROUND

It is common to use multiple displays communicatively coupled to a system-on-chip or graphics-processing unit (GPU). When an external display is added to an existing computing system, or when a display resolution is modified, a user experiences undesirable loss of audio, display blinking or display teaching. Loss of audio during external display connection creates unacceptable user experience.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
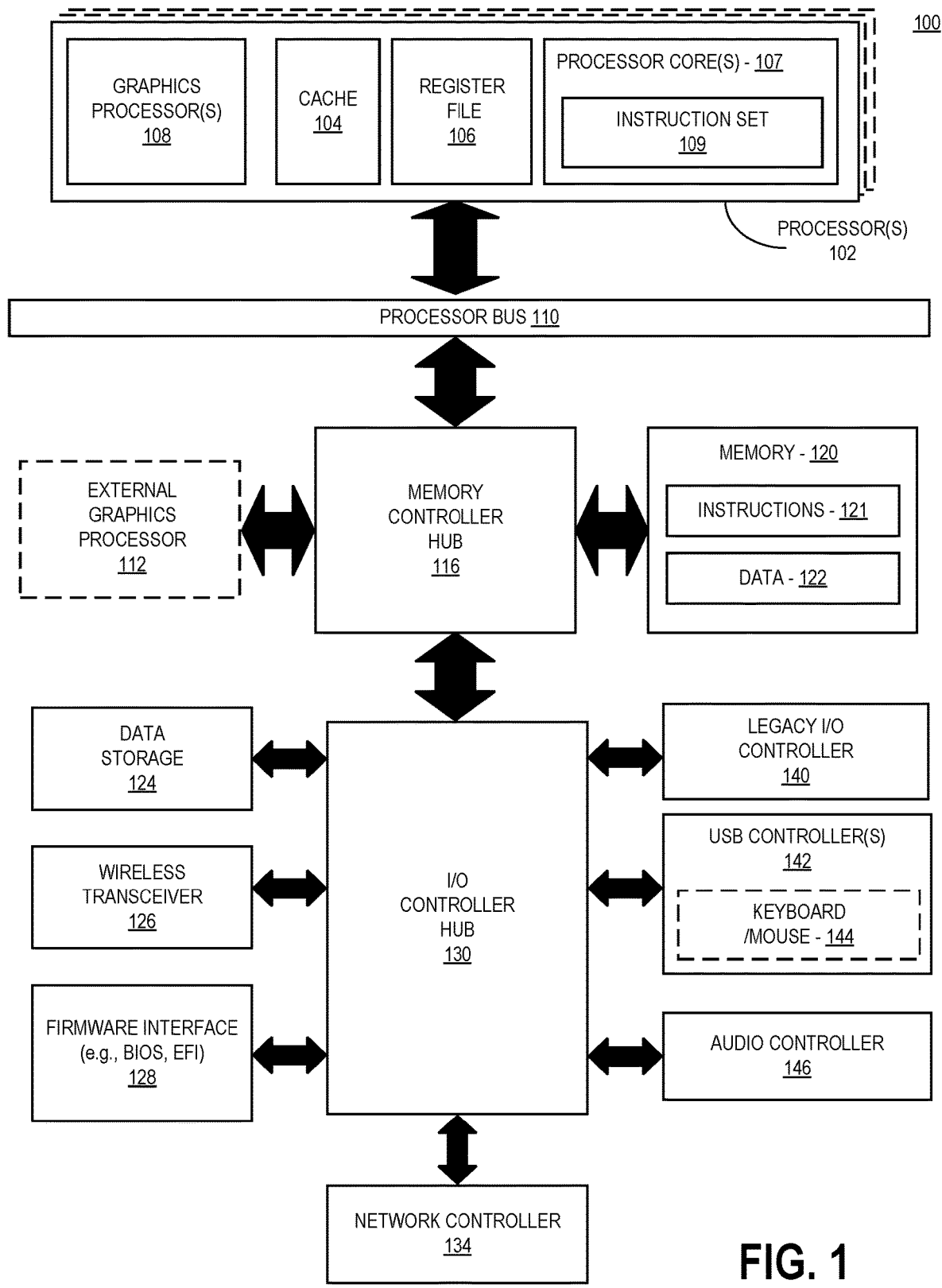
FIG. 1 illustrates a block diagram of a data processing system with apparatus to dynamically change display clock frequency, according to some embodiments of the disclosure.

One way to address the display blinking/tearing issue and/or loss of audio issue when an external display is added or its configuration is modified is to run the display engine or display controller of the GPU at its fastest phase locked clocked. However, operating the display controller at its fastest clock results in high power consumption. For example, 400 mW (milli watt) of power is wasted when the display controller is set to operate with the fastest display clock, impacting battery life. Another way to address the display blinking/tearing issue and/or loss of audio issue when an external display is added or its configuration is modified, is turn off the phase locked loop (PLL) associated with the display engine, and then relock the PLL at a higher clock frequency. In this case, the PLL, the display pipe, and display port may all be turned off. However, turning off the PLL causes disruption and negative user experience. Further, the technique of changing the clock frequency by turning off and then turning on the PLL may apply to internal embedded displays and not to multiple external displays. This is because, internal embedded displays are aligned with vertical blanking while external displays may not due to a wide spectrum of refresh rates (e.g., 30 to 120 Hz) and resolution modes per external display ports.

In some embodiments, upon external display configuration change, a graphics display driver or any suitable hardware or software modifies the clock frequency of the processor core (e.g., graphics processor core) display engine. In some embodiments, the graphics display driver or any suitable hardware or software reprograms the core display clock PLL (CDCLK PLL) to a new frequency, and relocks the PLL without any dead clocks during such frequency change. In some embodiments, a divide-by-2 divider changes the frequency of the PLL on the fly or dynamically. In other embodiments, other dividing ratios may used to generate divide-by-2, divide-by-4, etc. clocks for the display engine. The technique does not require the PLL to be turned off and turned back again at all.

There are many technical effects of various embodiments. For example, the technique of various embodiments eliminates the known associated issue of audio loss, and panel/monitor blanking, and at the same time helps to save power, and improve the performance of the overall system using various external display/s configurations. The dynamic frequency change upon display configuration update allows the SOC hardware to operate at or near the optimum frequency. As such, technique of various embodiments achieves better power and performance of the overall system by saving power and budgeting it back to the compute or render hardware to increase its throughput. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

Here, the term "analog signal" is any continuous signal for which the time varying feature (variable) of the signal is a representation of some other time varying quantity, i.e., analogous to another time varying signal.

Here, the term "digital signal" is a physical signal that is a representation of a sequence of discrete values (a quantified discrete-time signal), for example of an arbitrary bit stream, or of a digitized (sampled and analog-to-digital converted) analog signal.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a block diagram of a data processing system 100, according to some embodiments. Data processing system 100 includes one or more processors 102 and one or more graphics processors 108, and may be a single processor desktop system, a multiprocessor workstation system, or a server system having a large number of processors 102 or processor cores 107. In some embodiments, data processing system 100 is a system on a chip (SOC) integrated circuit for use in mobile, handheld, or embedded devices.

An embodiment of data processing system 100 can include, or be incorporated within a server-based gaming platform, a game console, including a game and media console, a mobile gaming console, a handheld game console, or an online game console. In some embodiments, data processing system is a mobile phone, smart phone, tablet computing device or mobile Internet device. Data processing system 100 can also include, couple with, or be integrated within a wearable device, such as a smart watch wearable device, smart eyewear device, augmented reality device, or virtual reality device. In some embodiments, data processing system 100 is a television or set top box device having one or more processors 102 and a graphical interface generated by one or more graphics processors 108.

In some embodiments, one or more processors 102 each include one or more processor cores 107 to process instructions which, when executed, perform operations for system and user software. In some embodiments, each of the one or more processor cores 107 is configured to process a specific instruction set 109. The instruction set 109 may facilitate Complex Instruction Set Computing (CISC), Reduced Instruction Set Computing (RISC), or computing via a Very Long Instruction Word (VLIW). Multiple processor cores 107 may each process a different instruction set 109 which may include instructions to facilitate the emulation of other instruction sets. Processor core 107 may also include other processing devices, such a Digital Signal Processor (DSP).

In some embodiments, processor 102 includes cache memory 104. Depending on the architecture, processor 102 can have a single internal cache or multiple levels of internal cache. In some embodiments, the cache memory is shared among various components of processor 102. In some embodiments, processor 102 also uses an external cache (e.g., a Level-3 (L3) cache or Last Level Cache (LLC)) (not shown) which may be shared among processor cores 107 using known cache coherency techniques. A register file 106 is additionally included in processor 102 which may include different types of registers for storing different types of data (e.g., integer registers, floating point registers, status registers, and an instruction pointer register). Some registers may be general-purpose registers, while other registers may be specific to the design of processor 102.

In some embodiments, processor 102 is coupled to processor bus 110 to transmit data signals between processor 102 and other components in system 100. System 100 uses an exemplary 'hub' system architecture, including a memory controller hub (MCH) 116 and an input output (I/O) controller hub 130. Memory controller hub 116 facilitates communication between a memory device and other components of the system 100, while I/O Controller Hub (ICH) 130 provides connections to I/O devices via a local I/O bus.

In some embodiments, memory device 120, can be a Dynamic Random Access Memory (DRAM) device, a Static Random Access Memory (SRAM) device, flash memory device, or some other memory device having suitable performance to serve as process memory. Memory 120 can store data 122 and instructions 121 for use when processor 102 executes a process. Memory controller hub 116 also couples with an optional external graphics processor 112, which may communicate with one or more graphics processors 108 in processor 102 to perform graphics and media operations.

The ICH 130 enables peripherals to connect to the memory 120 and processor 102 via a high-speed I/O bus. The I/O peripherals include an audio controller 146, a firmware interface 128 (e.g., BIOS, EFI), a wireless transceiver 126 (e.g., Wi-Fi, BLUETOOTH), a data storage device 124 (e.g., hard disk drive, flash memory, etc.), and a legacy I/O controller 140 for coupling legacy (e.g., Personal System 2 (PS/2)) devices to the system. One or more Universal Serial Bus (USB) controllers 142 connect input devices, such as keyboard and mouse combinations 144.

A network controller 134 may also couple to ICH 130. In some embodiments, a high-performance network controller (not shown) couples to processor bus 110.

Figure 2:
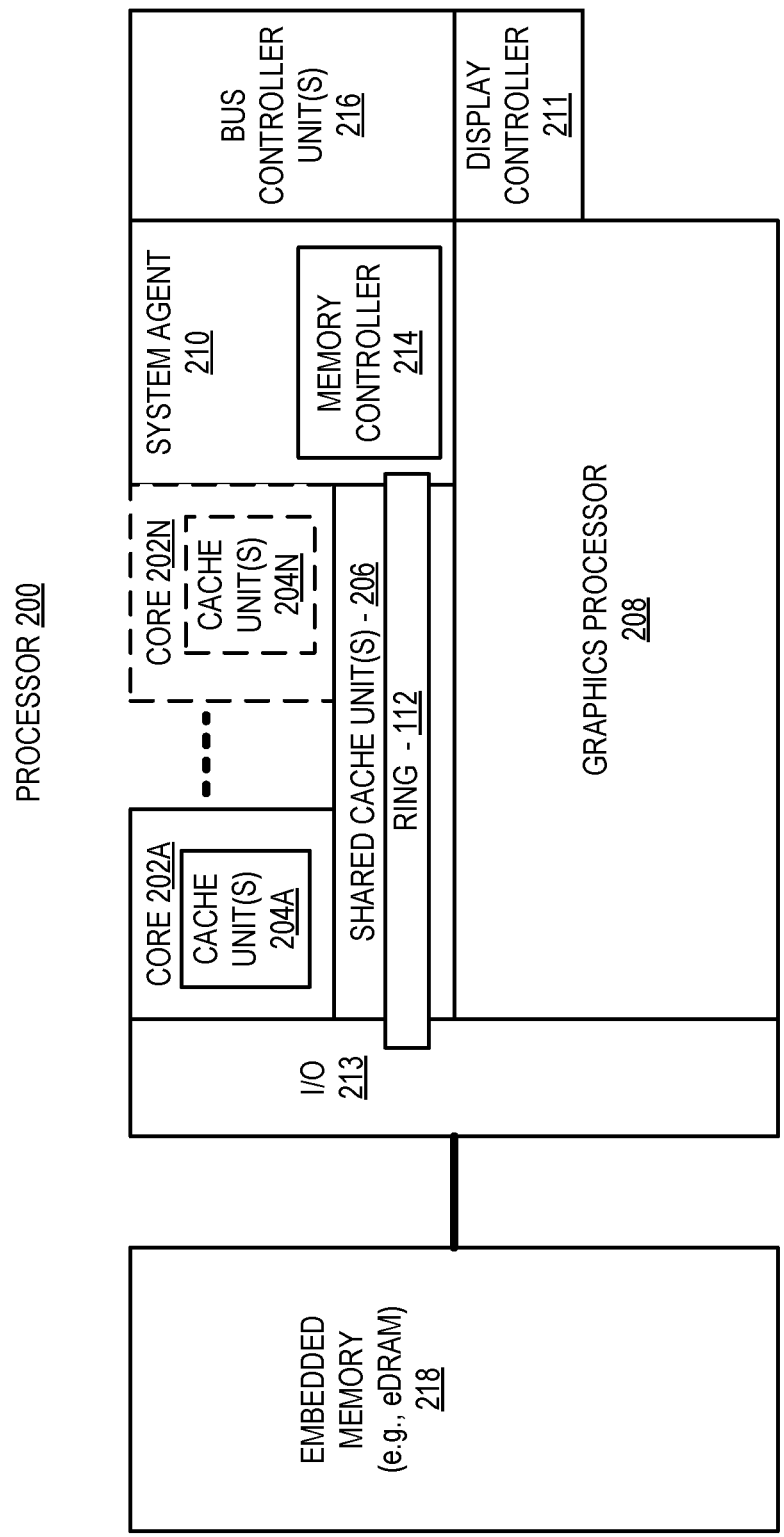
FIG. 2 illustrates a block diagram of a processor having one or more processor cores, an integrated memory controller, and an integrated graphics processor with apparatus to dynamically change display clock frequency according to some embodiments of the disclosure.

FIG. 2 illustrates a block diagram of an embodiment of processor 200 having one or more processor cores 202A-N, integrated memory controller 214, and integrated graphics processor 208. It is pointed out that those elements of FIG. 2 having the same reference numbers (or names) as the elements of any other figure can operate or function in any manner similar to that described, but are not limited to such.

Processor 200 can include additional cores up to and including additional core 202N represented by the dashed lined boxes. Each of the cores 202A-N includes one or more internal cache units 204A-N. In some embodiments, each core also has access to one or more shared cached units 206.

In some embodiments, internal cache units 204A-N and shared cache units 206 represent a cache memory hierarchy within processor 200.

The cache memory hierarchy may include at least one level of instruction and data cache within each core and one or more levels of shared mid-level cache, such as a Level-2 (L2), Level-3 (L3), Level-4 (L4), or other levels of cache, where the highest level of cache before external memory is classified as the last level cache (LLC). In some embodiments, cache coherency logic maintains coherency between the various cache units 206 and 204A-N.

In some embodiments, processor 200 may also include a set of one or more bus controller units 216 and system agent 210. The one or more bus controller units manage a set of peripheral buses, such as one or more Peripheral Component Interconnect buses (e.g., PCI, PCI Express). In some embodiments, system agent 210 provides management functionality for the various processor components. In some embodiments, system agent 210 includes one or more integrated memory controllers 214 to manage access to various external memory devices (not shown).

In some embodiments, one or more of the cores 202A-N includes support for simultaneous multi-threading. In such embodiments, system agent 210 includes components for coordinating and operating cores 202A-N during multi-threaded processing. In some embodiments, system agent 210 may additionally include a power control unit (PCU), which includes logic and components to regulate the power state of the cores 202A-N and graphics processor 208.

In some embodiments, processor 200 additionally includes a graphics processor 208 to execute graphics processing operations. In some embodiments, graphics processor 208 couples with the set of shared cache units 206, and system agent unit 210, including one or more integrated memory controllers 214. In some embodiments, display controller 211 is coupled with graphics processor 208 to drive graphics processor output to one or more coupled displays. In some embodiments, display controller 211 may be a separate module coupled with the graphics processor via at least one interconnect, or may be integrated within the graphics processor 208 or system agent 210.

In some embodiments, a ring based interconnect unit 212 is used to couple the internal components of processor 200, however an alternative interconnect unit may be used, such as a point to point interconnect, a switched interconnect, or other techniques, including techniques well known in the art. In some embodiments, graphics processor 208 couples with ring interconnect 212 via I/O link 213.

The example I/O link 213 represents at least one of multiple varieties of I/O interconnects, including an on package I/O interconnect which facilitates communication between various processor components and a high-performance embedded memory module 218, such as an eDRAM module. In some embodiments, each of cores 202-N and graphics processor 208 use embedded memory modules 218 as shared last level cache.

In some embodiments, cores 202A-N are homogenous cores executing the same instruction set architecture. In another embodiment, cores 202A-N are heterogeneous in terms of instruction set architecture (ISA), where one or more of cores 202A-N execute a first instruction set, while at least one of the other cores executes a subset of the first instruction set or a different instruction set.

In some embodiments, processor 200 can be a part of or implemented on one or more substrates using any of a number of process technologies, for example, Complementary metal-oxide-semiconductor (CMOS), Bipolar Junction/Complementary metal-oxide-semiconductor (BiCMOS) or N-type metal-oxide-semiconductor (NMOS) logic. Additionally, processor 200 can be implemented on one or more chips or as a system on a chip (SOC) integrated circuit having the illustrated components, in addition to other components.

Figure 3:
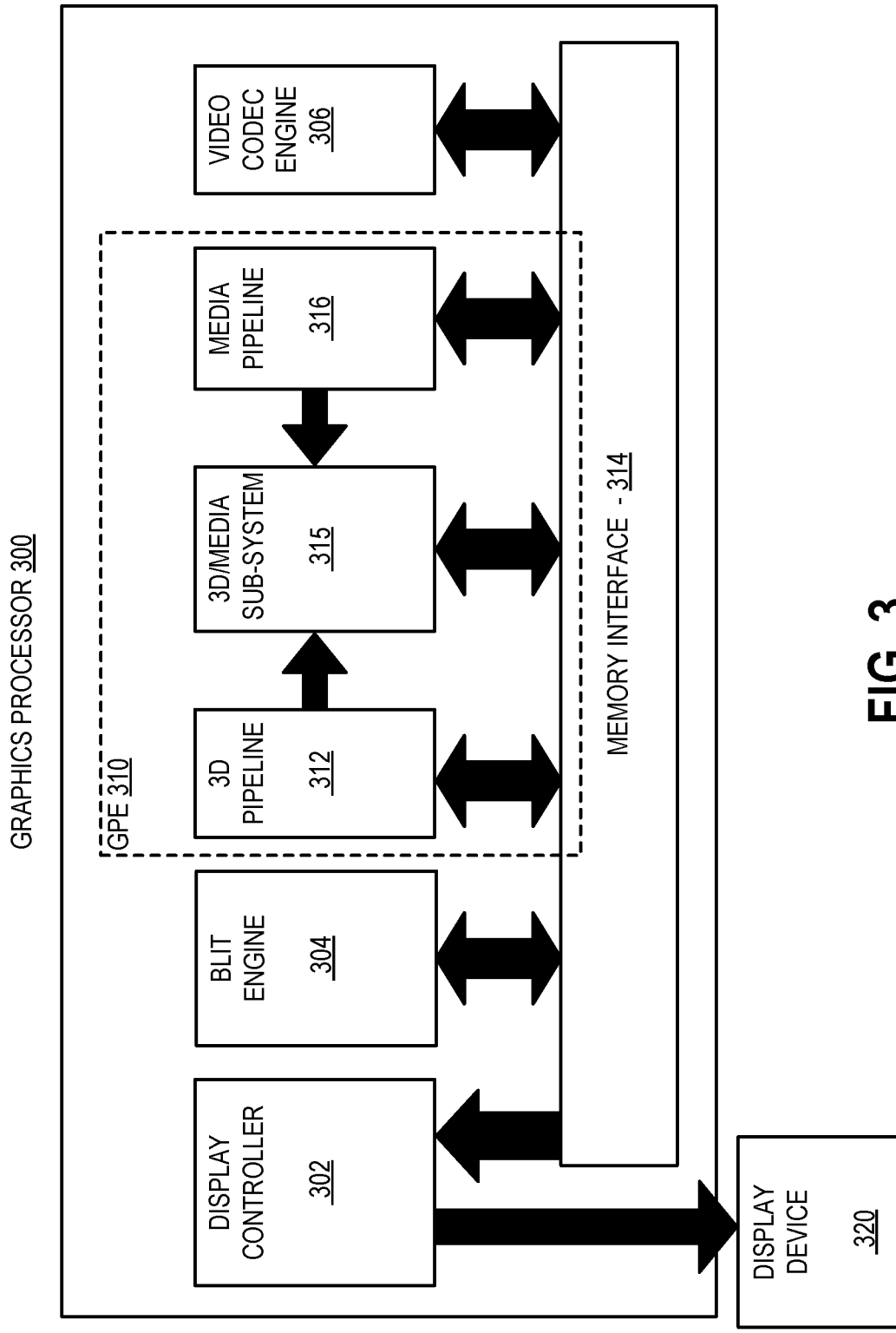
FIG. 3 illustrates a block diagram of a graphics processor, which may be a discreet graphics processing unit, or may be graphics processor integrated with a plurality of processing cores, according to some embodiments of the disclosure.

FIG. 3 illustrates a block diagram of one embodiment of a graphics processor 300 which may be a discrete graphics processing unit, or may be graphics processor integrated with a plurality of processing cores. It is pointed out that those elements of FIG. 3 having the same reference numbers (or names) as the elements of any other figure can operate or function in any manner similar to that described, but are not limited to such.

In some embodiments, the graphics processor is communicated with via a memory mapped I/O interface to registers on the graphics processor and via commands placed into the processor memory. In some embodiments, graphics processor 300 includes a memory interface 314 to access memory. In some embodiments, memory interface 314 can be an interface to local memory, one or more internal caches, one or more shared external caches, and/or to system memory.

In some embodiments, graphics processor 300 also includes a display controller 302 to drive display output data to a display device 320. In some embodiments, display controller 302 includes hardware for one or more overlay planes for the display and composition of multiple layers of video or user interface elements. In some embodiments, graphics processor 300 includes video codec engine 306 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421M/VC-1, and Joint Photographic Experts Group (JPEG) formats such as JPEG, and Motion JPEG (MJPEG) formats.

In some embodiments, graphics processor 300 includes a block image transfer (BLIT) engine 304 to perform two-dimensional (2D) rasterizer operations including, for example, bit-boundary block transfers. In some embodiments, 2D graphics operations are performed using one or more components of the graphics-processing engine (GPE) 310. In some embodiments, GPE 310 is a compute engine for performing graphics operations, including three-dimensional (3D) graphics operations and media operations, etc.

In some embodiments, GPE 310 includes a 3D pipeline 312 for performing 3D operations, such as rendering three-dimensional images and scenes using processing functions that act upon 3D primitive shapes (e.g., rectangle, triangle, etc.). In some embodiments, 3D pipeline 312 includes programmable and fixed function elements that perform various tasks within the element and/or spawn execution threads to 3D/Media sub-system 315. While 3D pipeline 312 can be used to perform media operations, an embodiment of GPE 310 also includes media pipeline 316 that is specifically used to perform media operations, such as video post processing and image enhancement.

In some embodiments, media pipeline 316 includes fixed function or programmable logic units to perform one or more specialized media operations, such as video decode acceleration, video de-interlacing, and video encode acceleration in place of, or on behalf of video codec engine 306. In some embodiments, media pipeline 316 additionally includes a thread spawning unit to spawn threads for execution on 3D/Media sub-system 315. The spawned threads perform computations for the media operations on one or more graphics execution units included in 3D/Media sub-system 315.

In some embodiments, 3D/Media subsystem 315 includes logic for executing threads spawned by 3D pipeline 312 and media pipeline 316. In some embodiments, the pipelines send thread execution requests to 3D/Media subsystem 315, which includes thread dispatch logic for arbitrating and dispatching the various requests to available thread execution resources. The execution resources include an array of graphics execution units to process the 3D and media threads. In some embodiments, 3D/Media subsystem 315 includes one or more internal caches for thread instructions and data. In some embodiments, the subsystem also includes shared memory, including registers and addressable memory, to share data between threads and to store output data.

Figure 4:
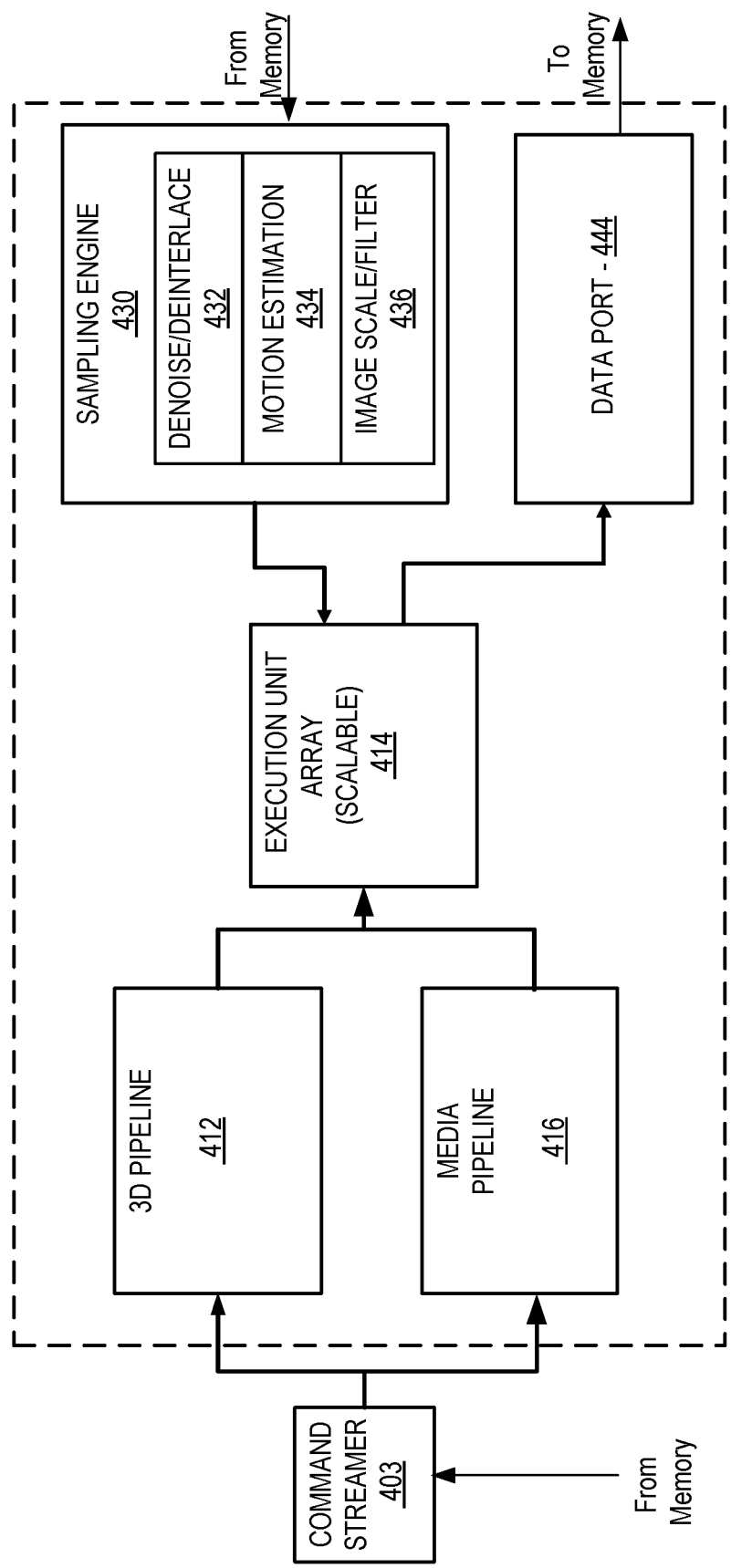
FIG. 4 illustrates a block diagram of a graphics-processing engine (GPE) for a graphics processor, according to some embodiments of the disclosure.

FIG. 4 illustrates a block diagram of an embodiment of GPE 410 for a graphics processor. It is pointed out that those elements of FIG. 4 having the same reference numbers (or names) as the elements of any other figure can operate or function in any manner similar to that described, but are not limited to such.

In some embodiments, GPE 410 is a version of the GPE 310 described with reference to FIG. 3. Referring back to FIG. 4, in some embodiments, GPE 410 includes 3D pipeline 412 and media pipeline 416, each of which can be either different from or similar to the implementations of 3D pipeline 312 and media pipeline 316 of FIG. 3.

Referring back to FIG. 4, in some embodiments, GPE 410 couples with command streamer 403, which provides a command stream to the GPE 3D and media pipelines 412, 416. In some embodiments, command streamer 403 is coupled to memory, which can be system memory, or one or more of internal cache memory and shared cache memory. In some embodiments, command streamer 403 receives commands from the memory and sends the commands to 3D pipeline 412 and/or media pipeline 416. The 3D and media pipelines process the commands by performing operations via logic within the respective pipelines or by dispatching one or more execution threads to execution unit array 414. In some embodiments, execution unit array 414 is scalable, such that the array includes a variable number of execution units based on the target power and performance level of GPE 410.

In some embodiments, sampling engine 430 couples with memory (e.g., cache memory or system memory) and execution unit array 414. In some embodiments, sampling engine 430 provides a memory access mechanism for scalable execution unit array 414 that allows execution unit array 414 to read graphics and media data from memory. In some embodiments, sampling engine 430 includes logic to perform specialized image sampling operations for media.

In some embodiments, the specialized media sampling logic in sampling engine 430 includes de-noise/de-interlace module 432, motion estimation module 434, and image scaling and filtering module 436. In some embodiments, de-noise/de-interlace module 432 includes logic to perform one or more of de-noise or de-interlace algorithms on the decoded video data. The de-interlace logic combines alternating fields of interlaced video content into a single frame of video. The de-noise logic reduces or removes data noise from the video and image data. In some embodiments, the de-noise logic and de-interlace logic are motion adaptive and use spatial or temporal filtering based on the amount of motion detected in the video data. In some embodiments, de-noise/de-interlace module 432 includes dedicated motion detection logic (e.g., within motion estimation module 434).

In some embodiments, motion estimation module 434 provides hardware acceleration for video operations by performing video acceleration functions such as motion vector estimation and prediction on video data. The motion estimation module 434 determines motion vectors that describe the transformation of image data between successive video frames.

In some embodiments, a graphics processor media codec uses the video motion estimation module 434 to perform operations on the video at the macro-block level that may otherwise be computationally intensive to perform using a general-purpose processor. In some embodiments, motion estimation module 434 is generally available to graphics processor components to assist with video decode and processing functions that are sensitive or adaptive to the direction or magnitude of the motion within video data.

In some embodiments, image scaling and filtering module 436 performs image-processing operations to enhance the visual quality of generated images and video. In some embodiments, scaling and filtering module 436 processes image and video data during the sampling operation before providing the data to execution unit array 414.

In some embodiments, GPE 410 includes data port 444, which provides an additional mechanism for graphics subsystems to access memory. In some embodiments, data port 444 facilitates memory access for operations including render target writes, constant buffer reads, scratch memory space reads/writes, and media surface accesses. In some embodiments, data port 444 includes cache memory space to cache accesses to memory. The cache memory can be a single data cache or separated into multiple caches for the multiple subsystems that access memory via the data port (e.g., a render buffer cache, a constant buffer cache, etc.). In some embodiments, threads executing on an execution unit in execution unit array 414 communicate with the data port by exchanging messages via a data distribution interconnect that couples each of the sub-systems of GPE 410.

Figure 5:
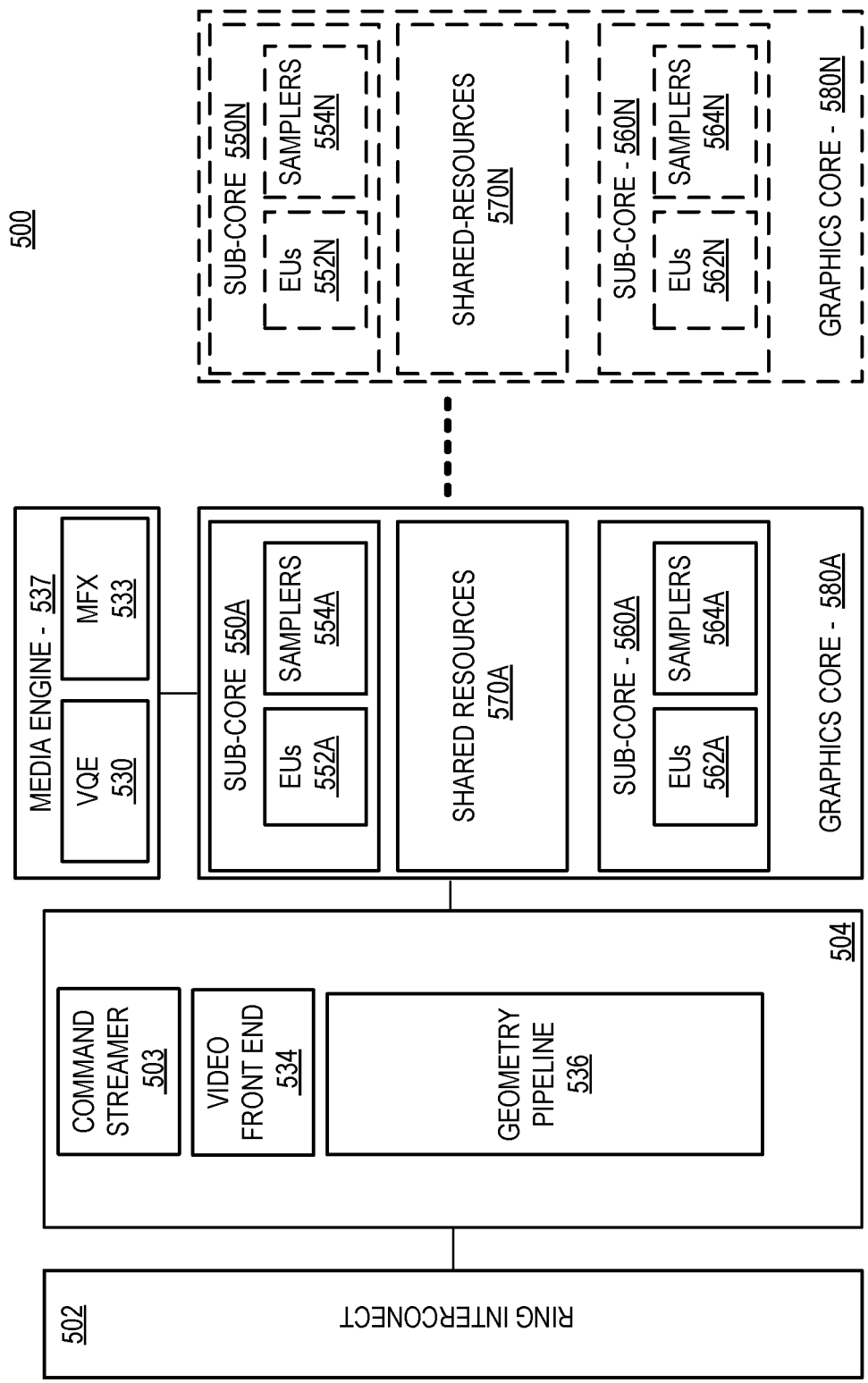
FIG. 5 illustrates a block diagram of another embodiment of a graphics processor related to an execution unit.

FIG. 5 illustrates a block diagram 500 of another embodiment of a graphics processor related to an execution unit. It is pointed out that those elements of FIG. 5 having the same reference numbers (or names) as the elements of any other figure can operate or function in any manner similar to that described, but are not limited to such.

In some embodiments, the graphics processor includes ring interconnect 502, pipeline front-end 504, media engine 537, and graphics cores 580A-N. In some embodiments, ring interconnect 502 couples the graphics processor to other processing units, including other graphics processors or one or more general-purpose processor cores. In some embodiments, the graphics processor is one of many processors integrated within a multi-core processing system.

In some embodiments, graphics processor receives batches of commands via ring interconnect 502. The incoming commands are interpreted by command streamer 503 in the pipeline front-end 504. The graphics processor includes scalable execution logic to perform 3D geometry processing and media processing via graphics core(s) 580A-N. For 3D geometry processing commands, command streamer 503 supplies the commands to geometry pipeline 536. For at least some media processing commands, command streamer 503 supplies the commands to video front end 534, which couples with media engine 537. In some embodiments, media engine 537 includes a Video Quality Engine (VQE) 530 for video and image post processing and multi-format encode/decode (MFX) 533 engine to provide hardware-accelerated media data encode and decode. In some embodiments, geometry pipeline 536 and media engine 537 each generate execution threads for the thread execution resources provided by at least one graphics core 580A.

The graphics processor includes scalable thread execution resources featuring modular cores 580A-N (sometime referred to as core slices), each having multiple sub-cores 550A-N, 560A-N (sometimes referred to as core sub-slices). The graphics processor can have any number of graphics cores 580A through 580N. In some embodiments, the graphics processor includes graphics core 580A having at least first sub-core 550A and second core sub-core 560A. In another embodiment, the graphics processor is a low power processor with a single sub-core (e.g., 550A). In some embodiments, the graphics processor includes multiple graphics cores 580A-N, each including a set of first sub-cores 550A-N and a set of second sub-cores 560A-N. Each sub-core in the set of first sub-cores 550A-N includes at least a first set of execution units 552A-N and media/texture samplers 554A-N. Each sub-core in the set of second sub-cores 560A-N includes at least a second set of execution units 562A-N and samplers 564A-N. In some embodiments, each sub-core 550A-N, 560A-N shares a set of shared resources 570A-N. In some embodiments, the shared resources include shared cache memory and pixel operation logic. Other shared resources may also be included in the various embodiments of the graphics processor.

Figure 6:
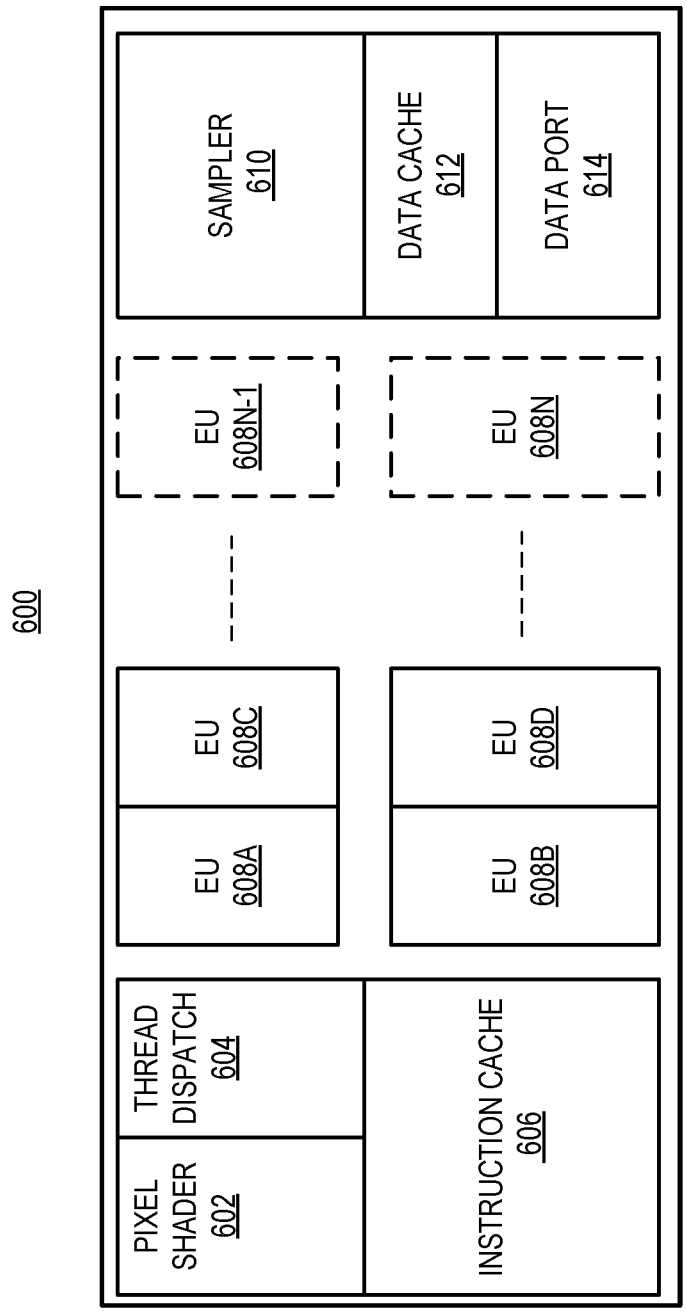
FIG. 6 illustrates thread execution logic including an array of processing elements employed in some embodiments of a GPE.

FIG. 6 illustrates thread execution logic 600 including an array of processing elements employed in one embodiment of a graphics processing engine. It is pointed out that those elements of FIG. 6 having the same reference numbers (or names) as the elements of any other figure can operate or function in any manner similar to that described, but are not limited to such.

In some embodiments, thread execution logic 600 includes pixel shader 602, thread dispatcher 604, instruction cache 606, scalable execution unit array including a plurality of execution units 608A-N, sampler 610, data cache 612, and data port 614. In some embodiments, the included components are interconnected via an interconnect fabric that links to each of the components. In some embodiments, thread execution logic 600 includes one or more connections to memory, such as system memory or cache memory, through one or more of instruction cache 606, data port 614, sampler 610, and the execution unit array includes execution units 608A-N. In some embodiments, each execution unit (e.g. 608A) is an individual vector processor capable of executing multiple simultaneous threads and processing multiple data elements in parallel for each thread In some embodiments, the execution unit array includes any number of individual execution units 608A-N.

In some embodiments, the execution unit array is primarily used to execute "shader" programs. In some embodiments, the execution units in the array execute an instruction set that includes native support for many standard 3D graphics shader instructions, such that shader programs from graphics libraries (e.g., Direct 3D and OpenGL) are executed with a minimal translation. The execution units support vertex and geometry processing (e.g., vertex programs, geometry programs, vertex shaders), pixel processing (e.g., pixel shaders, fragment shaders) and general-purpose processing (e.g., compute and media shaders).

Each execution unit in the execution unit array operates on arrays of data elements. The number of data elements is the "execution size," or the number of channels for the instruction. An execution channel is a logical unit of execution for data element access, masking, and flow control within instructions. The number of channels may be independent of the number of physical Arithmetic Logic Units (ALUs) or Floating Point Units (FPUs) for a particular graphics processor. In some embodiments, execution units 608A-N support integer and floating-point data types.

The execution unit instruction set includes single instruction multiple data (SIMD) instructions. The various data elements can be stored as a packed data type in a register and the execution unit will process the various elements based on the data size of the elements. For example, when operating on a 256-bit wide vector, the 256 bits of the vector are stored in a register and the execution unit operates on the vector as four separate 64-bit packed data elements (quad-word (QW) size data elements), eight separate 32-bit packed data elements (double word (DW) size data elements), sixteen separate 16-bit packed data elements (word (W) size data elements), or thirty-two separate 8-bit data elements (byte (B) size data elements). However, different vector widths and register sizes are possible.

One or more internal instruction caches (e.g., 606) are included in the thread execution logic 600 to cache thread instructions for the execution units. In some embodiments, one or more data caches (e.g., 612) are included to cache thread data during thread execution. In some embodiments, sampler 610 is included to provide texture sampling for 3D operations and media sampling for media operations. In some embodiments, sampler 610 includes specialized texture or media sampling functionality to process texture or media data during the sampling process before providing the sampled data to an execution unit.

During execution, the graphics and media pipelines send thread initiation requests to thread execution logic 600 via thread spawning and dispatch logic. In some embodiments, thread execution logic 600 includes local thread dispatcher 604 that arbitrates thread initiation requests from the graphics and media pipelines and instantiates the requested threads on one or more execution units 608A-N. For example, the geometry pipeline (e.g., 536 of FIG. 5) dispatches vertex processing, tessellation, or geometry processing threads to thread execution logic 600. Referring back to FIG. 6, in some embodiments, thread dispatcher 604 can also process runtime thread spawning requests from the executing shader programs.

Once a group of geometric objects have been processed and rasterized into pixel data, pixel shader 602 is invoked to further compute output information and cause results to be written to output surfaces (e.g., color buffers, depth buffers, stencil buffers, etc.). In some embodiments, pixel shader 602 calculates the values of the various vertex attributes that are to be interpolated across the rasterized object. In some embodiments, pixel shader 602 then executes an application programming interface (API) supplied pixel shader program. To execute the pixel shader program, pixel shader 602 dispatches threads to an execution unit (e.g., 608A) via the thread dispatcher 604. In some embodiments, pixel shader 602 uses texture sampling logic in sampler 610 to access texture data in texture maps stored in memory. Arithmetic operations on the texture data and the input geometry data compute pixel color data for each geometric fragment, or discards one or more pixels from further processing.

In some embodiments, data port 614 provides a memory access mechanism for thread execution logic 600 output processed data to memory for processing on a graphics processor output pipeline. In some embodiments, data port 614 includes or couples to one or more cache memories (e.g., data cache 612) to cache data for memory access via the data port.

Figure 7:
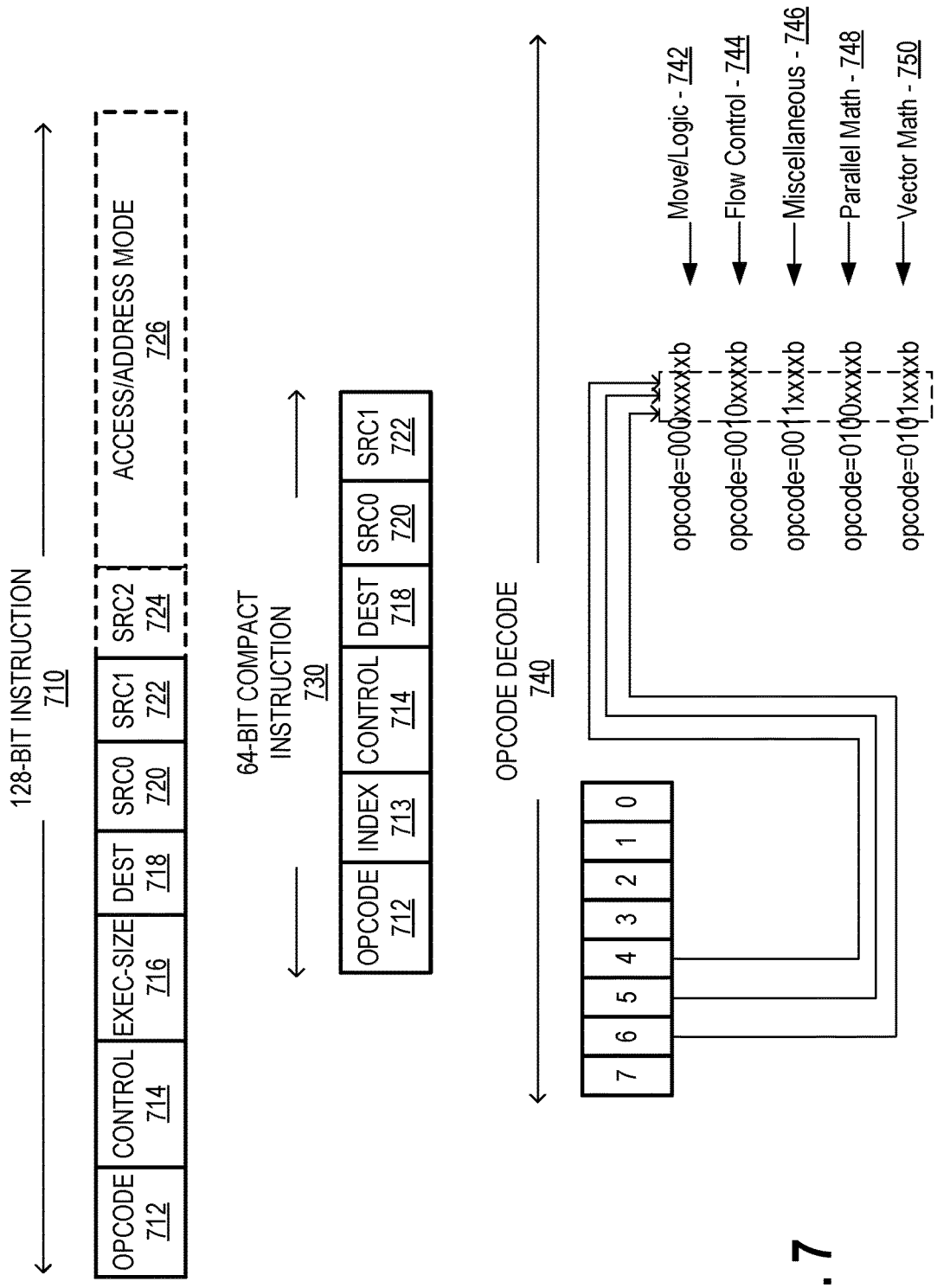
FIG. 7 illustrates a block diagram illustrating a graphics processor execution unit instruction format, according to some embodiments of the disclosure.

FIG. 7 illustrates a block diagram illustrating a graphics processor execution unit instruction format 700, according to some embodiments of the disclosure. In some embodiments, the graphics processor execution units support an instruction set having instructions in multiple formats. The solid lined boxes illustrate the components that are generally included in an execution unit instruction, while the dashed lines include components that are optional or that are only included in a sub-set of the instructions. The instruction format 700 described as illustrated are macro-instructions, in that they are instructions supplied to the execution unit, as opposed to micro-operations resulting from instruction decode once the instruction is processed.

In some embodiments, the graphics processor execution units natively support instructions in a 128-bit format 710. A 64-bit compacted instruction format 730 is available for some instructions based on the selected instruction, instruction options, and number of operands. The native 128-bit format 710 provides access to all instruction options, while some options and operations are restricted in the 64-bit format 730. The native instructions available in the 64-bit format 730 varies by embodiment. In some embodiments, the instruction is compacted in part using a set of index values in an index field 713. The execution unit hardware references a set of compaction tables based on the index values and uses the compaction table outputs to reconstruct a native instruction in the 128-bit format 710.

For each format, instruction opcode 712 defines the operation that the execution unit is to perform. The execution units execute each instruction in parallel across the multiple data elements of each operand. For example, in response to an add instruction, the execution unit performs a simultaneous add operation across each color channel representing a texture element or picture element. By default, the execution unit performs each instruction across all data channels of the operands. In some embodiments, instruction control field 712 enables control over certain execution options, such as channels selection (e.g., predication) and data channel order (e.g., swizzle). For 128-bit instruction format 710, an exec-size field 716 limits the number of data channels that will be executed in parallel. In some embodiments, exec-size field 716 is not available for use in the 64-bit compact instruction format 730.

Some execution unit instructions have up to three operands including two source (src) operands, src0 722, src1 722, and one destination operand 718. In some embodiments, the execution units support dual destination instructions, where one of the destinations is implied. Data manipulation instructions can have a third source operand (e.g., SRC2 724), where the instruction opcode JJ12 determines the number of source operands. An instruction's last source operand can be an immediate (e.g., hard-coded) value passed with the instruction.

In some embodiments, instructions are grouped based on opcode bit-fields to simplify Opcode decode 740. For an 8-bit opcode, bits 4, 5, and 6 allow the execution unit to determine the type of opcode. The precise opcode grouping shown is just an example. In some embodiments, move and logic opcode or instruction group 742 includes data movement and logic instructions (e.g., move (mov), compare (cmp)). In some embodiments, move and logic instruction group 742 shares the five most significant bits (MSB), where move (mov) instructions are in the form of 0000xxxxb (e.g., 0x0x) and logic instructions are in the form of 0001xxxxb (e.g., 0x01). A flow control instruction group 744 (e.g., call, jump (jmp), etc.,) includes instructions in the form of 0010xxxxb (e.g., 0x20). A miscellaneous instruction group 746 includes a mix of instructions, including synchronization instructions (e.g., wait, send) in the form of 0011xxxxb (e.g., 0x30). A parallel math instruction group 748 includes component-wise arithmetic instructions (e.g., add, multiply (mul)) in the form of 0100xxxxb (e.g., 0x40). The parallel math group 748 performs the arithmetic operations in parallel across data channels. The vector math group 750 includes arithmetic instructions (e.g., dp4) in the form of 0101xxxxb (e.g., 0x50). The vector math group performs arithmetic such as dot product calculations on vector operands.

Figure 8:
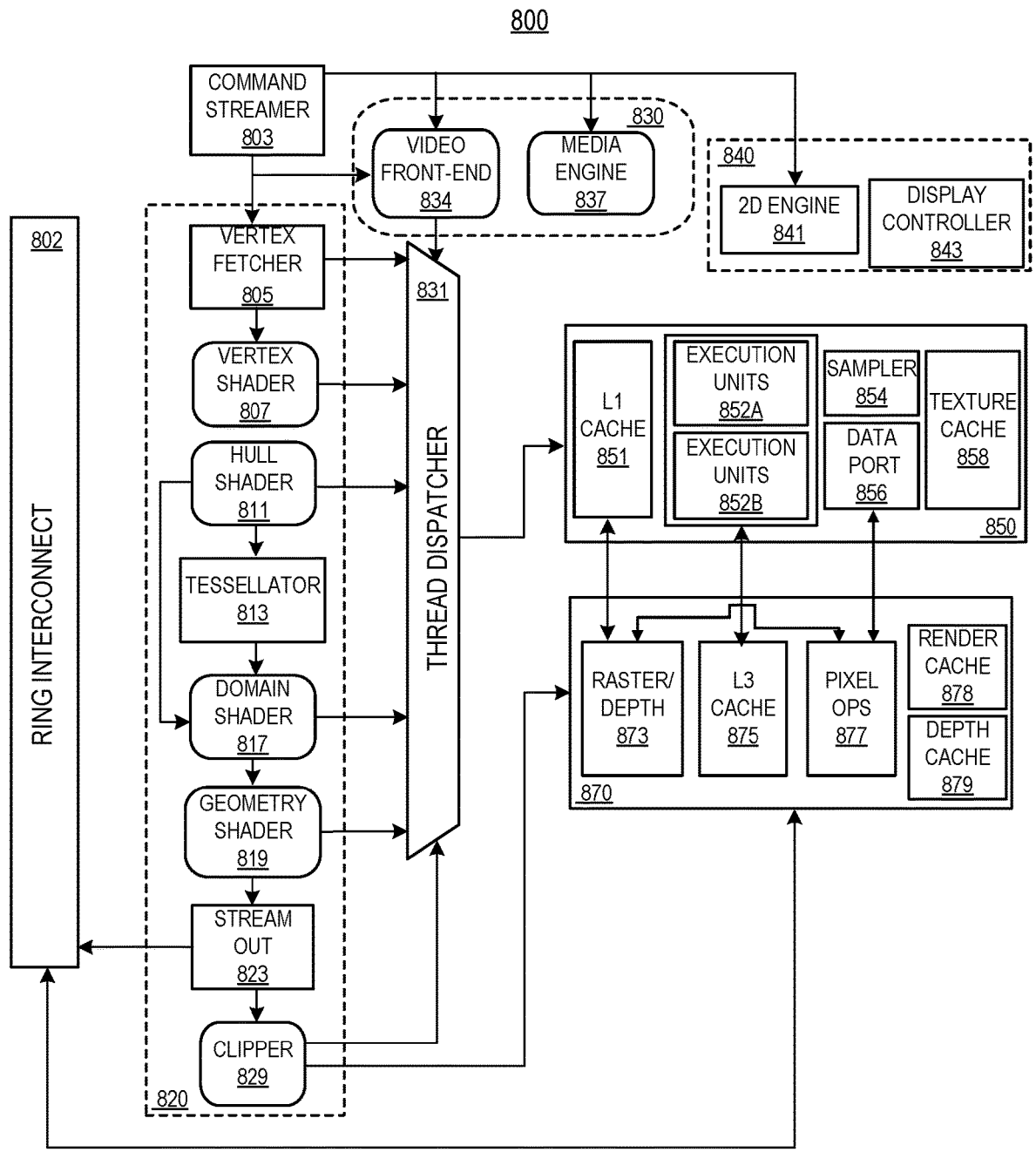
FIG. 8 is a block diagram of another embodiment of a graphics processor, which includes graphics pipeline, media pipeline, display engine, thread execution logic, and render output pipeline.

FIG. 8 is block diagram 800 of another embodiment of a graphics processor which includes graphics pipeline 820, media pipeline 830, display engine 840, thread execution logic 850, and render output pipeline 870. It is pointed out that those elements of FIG. 8 having the same reference numbers (or names) as the elements of any other figure can operate or function in any manner similar to that described, but are not limited to such.

In some embodiments, the graphics processor is a graphics processor within a multi-core processing system that includes one or more general purpose processing cores. The graphics processor is controlled by register writes to one or more control registers (not shown) or via commands issued to the graphics processor via ring interconnect 802. In some embodiments, ring interconnect 802 couples the graphics processor to other processing components, such as other graphics processors or general-purpose processors. Commands from ring interconnect 802 are interpreted by command streamer 803 which supplies instructions to individual components of graphics pipeline 820 or media pipeline 830.

In some embodiments, command streamer 803 directs the operation of a vertex fetcher 805 component that reads vertex data from memory and executes vertex-processing commands provided by command streamer 803. In some embodiments, vertex fetcher 805 provides vertex data to vertex shader 807, which performs coordinate space transformation and lighting operations to each vertex. In some embodiments, vertex fetcher 805 and vertex shader 807 execute vertex-processing instructions by dispatching execution threads to execution units 852A, 852B via thread dispatcher 831.

In some embodiments, execution units 852A, 852B are an array of vector processors having an instruction set for performing graphics and media operations. In some embodiments, execution units 852A, 852B have an attached L1 cache 851 that is specific for each array or shared between the arrays. The cache can be configured as a data cache, an instruction cache, or a single cache that is partitioned to contain data and instructions in different partitions.

In some embodiments, graphics pipeline 820 includes tessellation components to perform hardware-accelerated tessellation of 3D objects. A programmable hull shader 811 configures the tessellation operations. A programmable domain shader 817 provides back-end evaluation of tessellation output. A tessellator 813 operates at the direction of the hull shader 811 and contains special purpose logic to generate a set of detailed geometric objects based on a coarse geometric model that is provided as input to the graphics pipeline 820. In some embodiments, if tessellation is not used, the tessellation components 811, 813, and 817 can be bypassed.

In some embodiments, the complete geometric objects can be processed by geometry shader 819 via one or more threads dispatched to execution units 852A, 852B, or can proceed directly to clipper 829. In some embodiments, geometry shader 819 operates on the entire geometric objects, rather than the vertices or patches of vertices as in the previous stages of the graphics pipeline. If the tessellation is disabled, geometry shader 819 receives input from vertex shader 807. In some embodiments, geometry shader 819 is programmable by a geometry shader program to perform geometry tessellation if the tessellation units are disabled.

Prior to rasterization, vertex data is processed by clipper 829, which is either a fixed function clipper or a programmable clipper having clipping and geometry shader functions. In some embodiments, rasterizer 873 in render output pipeline 870 dispatches pixel shaders to convert the geometric objects into their per pixel representations. In some embodiments, pixel shader logic is included in thread execution logic 850.

The graphics engine has an interconnect bus, interconnect fabric, or some other interconnect mechanism that allows data and message passing amongst the major components of the graphics engine. In some embodiments, execution units 852A, 852B and associated cache(s) 851, texture and media sampler 854, and texture/sampler cache 858 interconnect via data port 856 to perform memory access and communicate with render output pipeline components of the graphics engine. In some embodiments, sampler 854, caches 851, 858, and execution units 852A, 852B each have separate memory access paths.

In some embodiments, render output pipeline 870 contains a rasterizer and depth test component 873 that converts vertex-based objects into their associated pixel-based representation. In some embodiments, the rasterizer logic includes a windower/masker unit to perform fixed function triangle and line rasterization. Associated render and depth buffer caches 878, 879 are also available in one embodiment. In some embodiments, pixel operations component 877 performs pixel-based operations on the data, though in some instances, pixel operations associated with 2D operations (e.g. bit block image transfers with blending) are performed by 2D engine 841 within display engine 840, or substituted at display time by display controller 843 using overlay display planes. In some embodiments, a shared L3 cache 875 is available to all graphics components, allowing the sharing of data without the use of main system memory.

In some embodiments, graphics processor media pipeline 830 includes media engine 837 and video front end 834. In some embodiments, video front end 834 receives pipeline commands from command streamer 803. In some embodiments, media pipeline 830 includes a separate command streamer. In some embodiments, video front-end 834 processes media commands before sending the command to media engine 837. In some embodiments, the media engine includes thread spawning functionality to spawn threads for dispatch to thread execution logic 850 via thread dispatcher 831.

In some embodiments, the graphics engine includes display engine 840. In some embodiments, display engine 840 is external to the graphics processor and couples with the graphics processor via ring interconnect 802, or some other interconnect bus or fabric. In some embodiments, display engine 840 includes 2D engine 841 and display controller 843. In some embodiments, display engine 840 contains special purpose logic capable of operating independently of the 3D pipeline. In some embodiments, display controller 843 couples with a display device (not shown), which may be a system integrated display device, as in a laptop computer, or an external display device attached via a display device connector.

In some embodiments, graphics pipeline 820 and media pipeline 830 are configurable to perform operations based on multiple graphics and media programming interfaces and are not specific to any one application programming interface (API). In some embodiments, driver software for the graphics processor translates the API calls that are specific to a particular graphics or media library into commands that can be processed by the graphics processor. In various embodiments, support is provided for the Open Graphics Library (OpenGL) and Open Computing Language (OpenCL) supported by the Khronos Group, the Direct3D library from the Microsoft® Corporation®, or, in one embodiment, both OpenGL and D3D. Support may also be provided for the Open Source Computer Vision Library (OpenCV). A future API with a compatible 3D pipeline would also be supported if a mapping can be made from the pipeline of the future API to the pipeline of the graphics processor.

Figure 9:
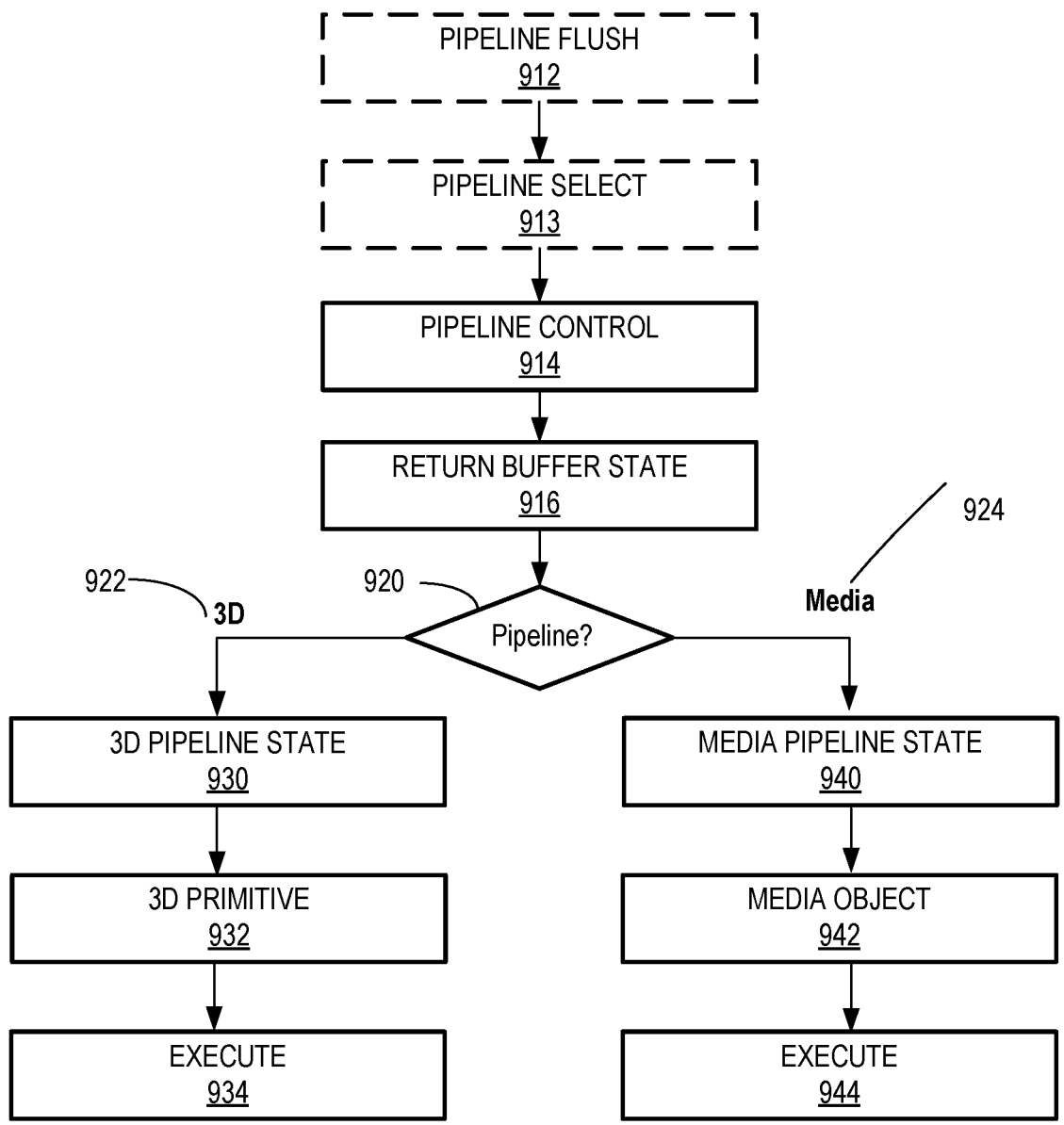
FIG. 9A illustrates a block diagram illustrating a graphics processor command format, according to some embodiments.
FIG. 9B illustrates a block diagram of a graphics processor command sequence, according to some embodiments of the disclosure.

FIG. 9A illustrates a block diagram illustrating a graphics processor command format 900, according to some embodiments, and FIG. 9B illustrates a block diagram of a graphics processor command sequence 910 according to some embodiments of the disclosure. It is pointed out that those elements of FIGS. 9A-B having the same reference numbers (or names) as the elements of any other figure can operate or function in any manner similar to that described, but are not limited to such.

The solid lined boxes in FIG. 9A illustrate the components that are generally included in a graphics command while the dashed lines include components that are optional or that are only included in a sub-set of the graphics commands. The example graphics processor command format 900 of FIG. 9A includes data fields to identify target client 902 of the command, command operation code (opcode) 904, and relevant data 906 for the command. In some embodiments, sub-opcode 905 and command size 908 are also included in some commands.

In some embodiments, client 902 specifies the client unit of the graphics device that processes the command data. In some embodiments, a graphics processor command parser examines the client field of each command to condition the further processing of the command and route the command data to the appropriate client unit. In some embodiments, the graphics processor client units include a memory interface unit, a render unit, a 2D unit, a 3D unit, and a media unit. Each client unit has a corresponding processing pipeline that processes the commands. Once the command is received by the client unit, the client unit reads opcode 904 and, if present, sub-opcode 905 to determine the operation to perform. The client unit performs the command using information in data 906 field of the command. For some commands, an explicit command size 908 is expected to specify the size of the command. In some embodiments, the command parser automatically determines the size of at least some of the commands based on the command opcode. In some embodiments, commands are aligned via multiples of a double word.

The flow chart in FIG. 9B shows a sample command sequence 910 in some embodiments. Although the blocks in sample command sequence 910 are shown in a particular order, the order of the actions can be modified. Thus, the illustrated embodiments can be performed in a different order, and some actions/blocks may be performed in parallel. Some of the blocks and/or operations listed are optional in accordance with certain embodiments. The numbering of the blocks presented is for the sake of clarity and is not intended to prescribe an order of operations in which the various blocks must occur. Additionally, operations from the various flows may be utilized in a variety of combinations.

In some embodiments, software or firmware of a data processing system that features an embodiment of the graphics processor uses a version of the command sequence shown to set up, execute, and terminate a set of graphics operations. A sample command sequence is shown and described for illustrative purposes, however embodiments are not limited to these commands or to this command sequence. Moreover, the commands may be issued as a batch of commands in a command sequence, such that the graphics processor will process the sequence of commands in an at least partially concurrent manner.

In some embodiments, sample command sequence 910 may begin with pipeline flush command 912 to cause any active graphics pipeline to complete the currently pending commands for the pipeline. In some embodiments, 3D pipeline 922 and media pipeline 924 do not operate concurrently. The pipeline flush is performed to cause the active graphics pipeline to complete any pending commands. In some embodiments, in response to a pipeline flush, the command parser for the graphics processor will pause command processing until the active drawing engines complete pending operations and the relevant read caches are invalidated. Optionally, any data in the render cache that is marked 'dirty' can be flushed to memory. In some embodiments, pipeline flush command 912 can be used for pipeline synchronization or before placing the graphics processor into a low power state.

In some embodiments, pipeline select command 913 is used when a command sequence requires the graphics processor to explicitly switch between pipelines. In some embodiments, pipeline select command 913 is required only once within an execution context before issuing pipeline commands unless the context is to issue commands for both pipelines. In some embodiments, a pipeline flush command 912 is required immediately before a pipeline switch via the pipeline select command 913.

In some embodiments, pipeline control command 914 configures a graphics pipeline for operation and is used to program 3D pipeline 922 and media pipeline 924. In some embodiments, pipeline control command 914 configures the pipeline state for the active pipeline. In some embodiments, the pipeline control command 914 is used for pipeline synchronization and to clear data from one or more cache memories within the active pipeline before processing a batch of commands.

Return buffer state commands 916 are used to configure a set of return buffers for the respective pipelines to write data. Some pipeline operations require the allocation, selection, or configuration of one or more return buffers into which the operations write intermediate data during processing. The graphics processor also uses one or more return buffers to store output data and to perform cross thread communication. In some embodiments, return buffer state 916 includes selecting the size and number of return buffers to use for a set of pipeline operations.

The remaining commands in the command sequence differ based on the active pipeline for operations. Based on pipeline determination 920, the command sequence is tailored to 3D pipeline 922 beginning with 3D pipeline state 930, or media pipeline 924 beginning at media pipeline state 940.

The commands for 3D pipeline state 930 include 3D state setting commands for vertex buffer state, vertex element state, constant color state, depth buffer state, and other state variables that are to be configured before 3D primitive commands are processed. The values of these commands are determined at least in part based on the particular 3D API in use. In some embodiments, 3D pipeline state 930 commands are also able to selectively disable or bypass certain pipeline elements if those elements will not be used.

In some embodiments, 3D primitive 932 command is used to submit 3D primitives to be processed by the 3D pipeline. Commands and associated parameters that are passed to the graphics processor via 3D primitive 932 command are forwarded to the vertex fetch function in the graphics pipeline. The vertex fetch function uses 3D primitive 932 command data to generate vertex data structures. The vertex data structures are stored in one or more return buffers. In some embodiments, 3D primitive 932 command is used to perform vertex operations on 3D primitives via vertex shaders. To process vertex shaders, 3D pipeline 922 dispatches shader execution threads to graphics processor execution units.

In some embodiments, 3D pipeline 922 is triggered via execute 934 command or event. In some embodiments, a register write triggers command execution. In some embodiments, execution is triggered via a 'go' or 'kick' command in the command sequence. In one embodiment command execution is triggered using a pipeline synchronization command to flush the command sequence through the graphics pipeline. The 3D pipeline will perform geometry processing for the 3D primitives. Once operations are complete, the resulting geometric objects are rasterized and the pixel engine colors the resulting pixels. Additional commands to control pixel shading and pixel back end operations may also be included for those operations.

In some embodiments, sample command sequence 910 follows media pipeline 924 path when performing media operations. In general, the specific use and manner of programming for media pipeline 924 depends on the media or compute operations to be performed. Specific media decode operations may be offloaded to the media pipeline during media decode. The media pipeline can also be bypassed and media decode can be performed in whole or in part using resources provided by one or more general purpose processing cores. In some embodiments, the media pipeline also includes elements for general-purpose graphics processor unit (GPGPU) operations, where the graphics processor is used to perform SIMD vector operations using computational shader programs that are not explicitly related to the rendering of graphics primitives.

In some embodiments, media pipeline 924 is configured in a similar manner to 3D pipeline 922. A set of media pipeline state commands 940 are dispatched or placed into a command queue before media object commands 942. In some embodiments, media pipeline state commands 940 include data to configure the media pipeline elements that will be used to process the media objects. This includes data to configure the video decode and video encode logic within the media pipeline, such as encode or decode format. In some embodiments, media pipeline state commands 940 also support the use of one or more pointers to "indirect" state elements that contain a batch of state settings.

In some embodiments, media object commands 942 supply pointers to media objects for processing by the media pipeline. The media objects include memory buffers containing video data to be processed. In some embodiments, all media pipeline states must be valid before issuing media object command 942. Once the pipeline state is configured and media object commands 942 are queued, media pipeline 924 is triggered via execute 934 command or an equivalent execute event (e.g., register write). Output from media pipeline 924 may then be post processed by operations provided by 3D pipeline 922 or media pipeline 924. In some embodiments, GPGPU operations are configured and executed in a similar manner to media operations.

Figure 10:
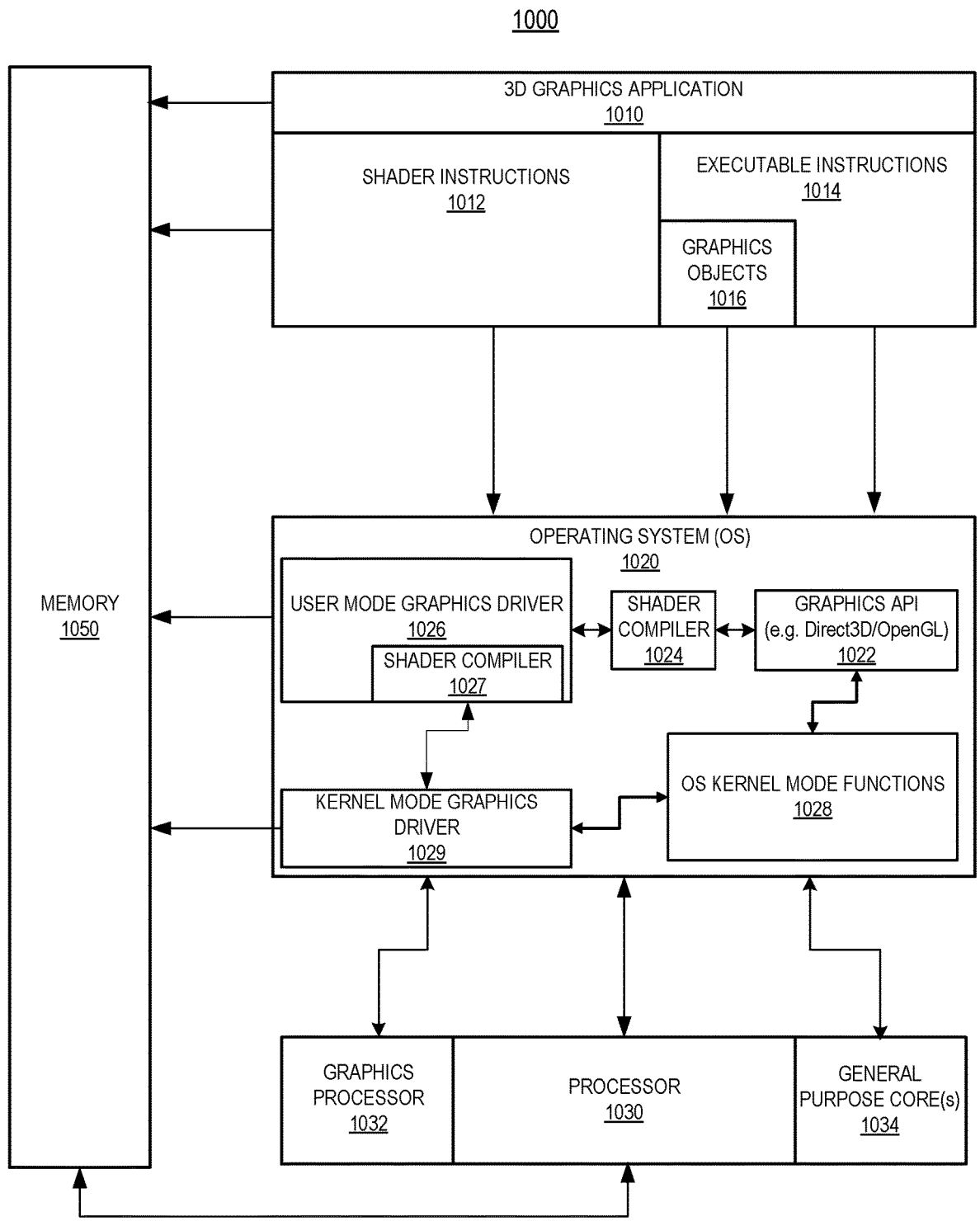
FIG. 10 illustrates a graphics software architecture for a data processing system according to some embodiments of the disclosure.

FIG. 10 illustrates a graphics software architecture 1000 for a data processing system according to some embodiments of the disclosure. It is pointed out that those elements of FIG. 10 having the same reference numbers (or names) as the elements of any other figure can operate or function in any manner similar to that described, but are not limited to such.

In some embodiments, software architecture includes 3D graphics application 1010, operating system 1020, and at least one processor 1030. In some embodiments, processor 1030 includes graphics processor 1032 and one or more general-purpose processor core(s) 1034. In some embodiments, graphics application 1010 and operating system 1020 each execute in system memory 1050 of the data processing system.

In some embodiments, 3D graphics application 1010 contains one or more shader programs including shader instructions 1012. The shader language instructions may be in a high-level shader language, such as the High Level Shader Language (HLSL) or the OpenGL Shader Language (GLSL). The application also includes executable instructions 1014 in a machine language suitable for execution by the general-purpose processor core(s) 1034. The application also includes graphics objects 1016 defined by vertex data.

In some embodiments, operating system 1020 may be a Microsoft® Windows® operating system from the Microsoft Corporation, a proprietary UNIX®-like operating system, or an open source UNIX®-like operating system using a variant of the Linux® kernel. When the Direct3D API is in use, operating system 1020 uses a front-end shader compiler 1024 to compile any shader instructions 1012 in HLSL into a lower-level shader language. The compilation may be a just-in-time compilation or the application can perform share pre-compilation. In one embodiment, high-level shaders are compiled into low-level shaders during the compilation of 3D graphics application 1010.

In some embodiments, user mode graphics driver 1026 may contain a back-end shader compiler 1027 to convert shader instructions 1012 into a hardware specific representation. When the OpenGL API is in use, shader instructions 1012 in the GLSL high-level language are passed to user mode graphics driver 1026 for compilation. In some embodiments, user mode graphics driver 1026 uses operating system kernel mode functions 1028 to communicate with kernel mode graphics driver 1029. In some embodiments, kernel mode graphics driver 1029 communicates with graphics processor 1032 to dispatch commands and instructions.

To the extent various operations or functions are described herein, they can be described or defined as hardware circuitry, software code, instructions, configuration, and/or data. The content can be embodied in hardware logic, or as directly executable software ("object" or "executable" form), source code, high level shader code designed for execution on a graphics engine, or low level assembly language code in an instruction set for a specific processor or graphics core. The software content of the embodiments described herein can be provided via an article of manufacture with the content stored thereon, or via a method of operating a communication interface to send data via the communication interface.

A non-transitory machine readable storage medium can cause a machine to perform the functions or operations described, and includes any medium that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface is configured by providing configuration parameters or sending signals to prepare the communication interface to provide a data signal describing the software content. The communication interface can be accessed via one or more commands or signals sent to the communication interface.

Various components described can perform the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc. Besides what is described herein, various modifications can be made to the disclosed embodiments and implementations of the invention without departing from their scope. Therefore, the illustrations and examples herein should be construed in an illustrative, and not a restrictive sense. The scope of the disclosure should be measured solely by reference to the claims that follow.

Figure 11:
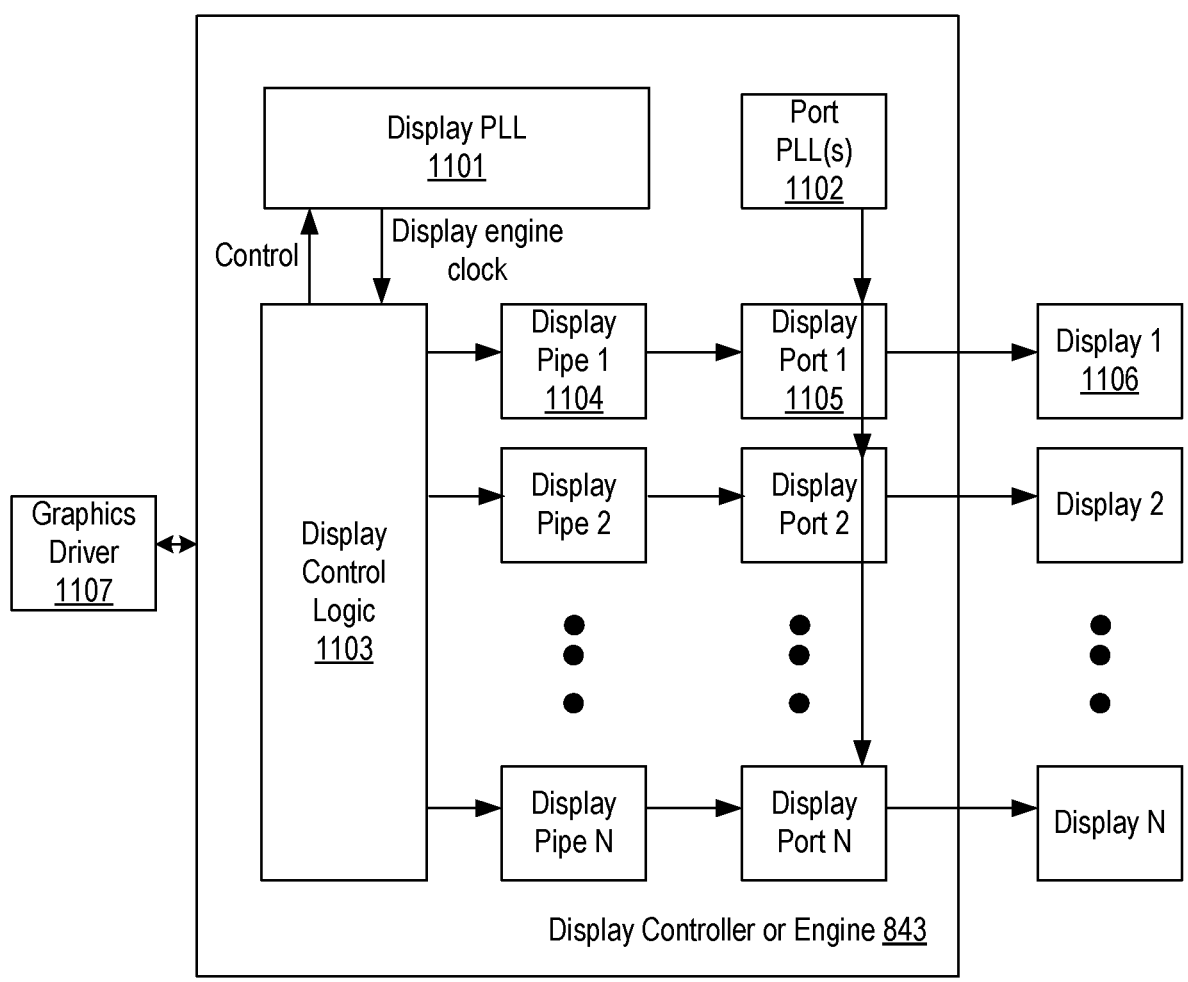
FIG. 11 illustrates a simplified embodiment of a display engine coupled to ports, which are coupled to multiple displays.

FIG. 11 illustrates a simplified embodiment 1100 of display engine 843 coupled to ports, which are coupled to multiple displays. Embodiment 1100 illustrates some high-level details of the display controller or engine 843, which includes a display phase locked loop (PLL) 1101, display port PLL(s) 1102, display control logic 1103, display pipes 1 though N 1104, and display ports 1 to N 1105, where N is an integer. Display PLL 1101 provides display engine clock to display control logic 1103. In some embodiments, Display PLL 1101 modifies frequency of a display engine clock in accordance with logic level of control signal. For example, Display PLL 1101 may reduce the frequency of the display engine clock by half when the control signal is assert (e.g., logic 1). Display Port PLLs 1102 provides port clock(s) for the display ports. A graphics driver 1107 may cause display control logic 1103 to assert or de-assert the control signal.

Embodiment 1100 also includes a plurality of display devices 1106 (1 though N) that can be communicatively coupled via one or more of N display ports 1105 to the computer system (or display controller 843). Each of the plurality of display ports 1105 provides support for display interface protocols.

Display interface protocols can include High-Definition Multimedia Interface (HDMI), Digital Video Interface (DVI), Mobile Industry Processor Interface-Display Serial Interface (MIPI-DSI), Universal Serial Bus type-c (USBc), Wireless Display (WiDi), Video Graphics Array (VGA), Display Port (DP), DP multi-stream or embedded Display Port (eDP). DisplayPort multi-stream can have multiple pipes driving a single Digital Display Interface.

The image data stored in the frame buffer represents pixels to be displayed on the display. A pixel is the smallest addressable element in a display. For example, 32-bits in the frame buffer may represent one pixel in the display. In another example, one or more of the 32-bits may represent the color of the pixel.

Display controller 843 uses a display engine clock (that can also be referred to as a core display clock or a display clock) to access the image(s) stored in a system memory. Display PLL 1101 provides display engine clock. Display controller 843 inserts the image(s) read from the system memory to a display pipe 1104 for processing prior to being displayed on the display device 1106.

Each display pipe 1104 operates independently from the other display pipes. Display pipe 1104 blends and synchronizes pixel data received from one or more display planes. In addition, the display pipe 1104 adds timing for display device 1106 upon which the image is to be displayed. Display pipe 1104 can perform operations on the image data including blending, color correction, display power saving (for example, adaptively reduce backlight brightness of the display device), scaling, dithering, and clipping.

Each display port 1105 includes transmit logic and a physical connector. A display device 1106 can be coupled to the display port 1105 via the physical connector. For example, a WiDi or WiGig port of display engine or display controller can be used for wireless connection of display device 1106. Display port 1105 transmits data received from the respective display pipe 1104 to display device 1106.

Display device 1106 can be hot plugged into display port 1105 while both the display device 1106 and the computer system are powered on. Hot plug detect (HPD) is supported by display protocols such as HDMI, display port and DVI. Typically, hot plug relies on a single pin in a display port connector to contact display device 1106 to initiate a hot plug process.

Display controller 843 also includes display PLL 1101. The frequency of the display engine clock impacts the maximum supported pixel rate. Display controller 843 (also referred to as a display engine) can be configured for the lowest display engine clock frequency necessary to support the current display configuration to save power. A display controller 843 may be configured to use a higher display engine clock frequency than necessary in order to reduce the need to change the frequency of the display engine clock when the display configuration is changed.

In some embodiments, after the system powers on, display 1106 is setup as per the boot up sequence. Any time display configuration changes (e.g. due to user action of attaching another display/s, changing resolution of existing external display, running certain applications which requires change of configuration, and other events) requires change of display clock frequency. In some embodiments, the change in display clock frequency is performed by a divide-by-2 circuitry of display PLL 1101. In some embodiments, other divider rations may be used. For example, change in display clock frequency is performed by dividers that can divide by any suitable ratio needed for the display. In various embodiments, the change in display clock frequency is carried out without disabling Display PLL 1101. As such, there are no dead clocks and therefore no loss of audio or no display blanking or tearing affect to displays 1106. In some embodiments, the change in frequency is requested by graphics driver 1107.

In various embodiments, logic 1103 modifies the frequency of the display engine clock to a highest frequency required by any of the one or more displays (1106) including the embedded and non-embedded displays. In some embodiments, logic 1106 increases the frequency of the display engine clock when the resolution of the non-embedded display is higher than a resolution of the embedded display. In some embodiments, logic 1103 decreases the frequency of the display engine clock when the resolution of the non-embedded display is lower than a resolution of the embedded display. For example, in the case of 4K embedded display, and when an external display changes its resolution between 28×19 and 5K, logic 1103 reduces the frequency of the display engine clock from 652.8 MHz to 326.4 MHz via a divide-by-two circuitry. In some embodiments, display controller 843 is embedded in the graphics processor. While the ports 1105 are referred to as display ports, these ports can be any one of: Display Port, HDMI, EDP, MIPI DSI, WIDI, WIGIG, VGA, or MHL.

The elimination of audio loss and display blanking/blinking/tearing provides better user experience, and also the freedom to switch display engine clock frequency dynamically and seamlessly for saving power even with external display configuration usages. Here, the term dynamically or automatically generally refers to change in display engine clock frequency without turning off display PLL, resetting the display PLL, unlocking the display PLL, or changing any of its internal signals such as its oscillator control voltage (or code). For example, when the frequency of the display engine clock is modified, the PLL remains locked. A PLL is declared lock when the phase different between a reference and feedback clock is below a threshold. In some embodiments, the saved power is budgeted back to the compute or render hardware to improve overall system performance, which improves battery life.

Figure 12:
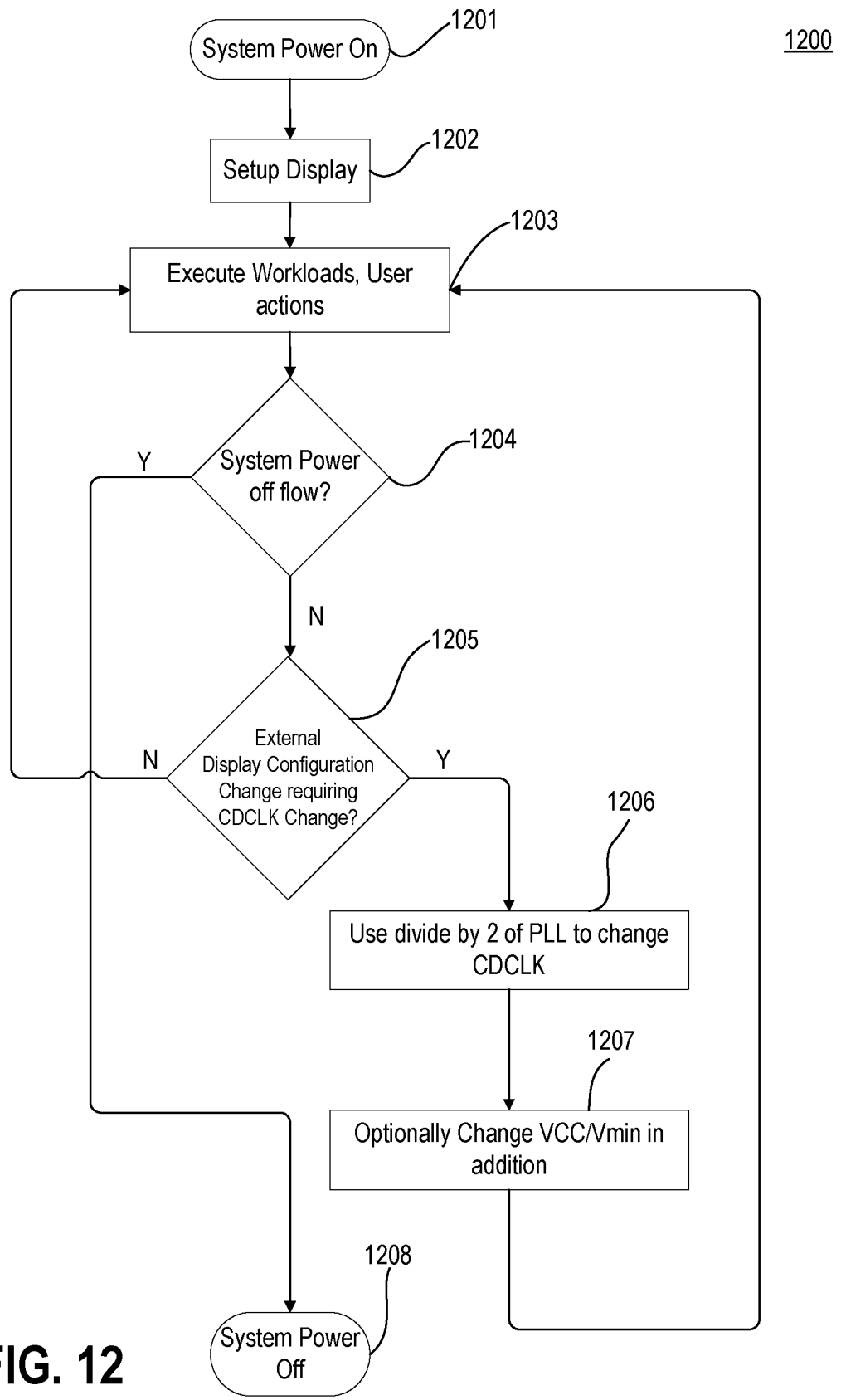
FIG. 12 illustrates a flowchart of a state diagram showing dynamic frequency adjustment of clock of the display engine (or controller) due to change in configuration of an external display, in accordance with some embodiments.

FIG. 12 illustrates flowchart 1200 of a state diagram showing dynamic frequency adjustment of clock of the display engine (or controller) due to change in configuration of an external display, in accordance with some embodiments. While the blocks of flowchart 1200 are illustrated in a particular order, the order can be changed. For example, some blocks may be performed before others or in parallel to others.

A block 1201, the computer system powers on. For example, the computer system with an embedded display turns on and is powered by a power from a wall or battery. The process then continues to block 1202. At block 1202, an external display 1106 (other than the embedded display) is setup as per the boot-up sequence. The process then continues to block 1203 where workloads and/or other user actions are executed by processor core or execution units 608. The process then proceeds to block 1204. At block 1204, a determination is made about the system power off flow. If the system power flow is determined to be off, the process proceeds to block 1208 where the computer system is powered off. If the system power flow is determined to remain on, the process proceeds to block 1205.

At block 1205, a determination is made whether any of the non-embedded displays is changing its configuration. Here, embedded display refers to a display system integrally attached to the CPU or GPU. For example, a laptop screen is an embedded display because it is part of the same assembly that houses the GPU and is directly connected to the GPU without the external display port usage. Conversely, a non-embedded display or an external display is a display system, which is coupled to the GPU through an external display port. For example, a display, which is in addition to an embedded display, is a non-embedded display. Any number of displays, other than the embedded display, that can be coupled to the display ports are non-embedded displays.

At block 1205, display controller 843, of any other suitable logic, makes a determination whether display configuration of a non-embedded one or more displays changed. Here, a change in display configuration may include user action of attaching another display to a display port, changing resolution of an existing active external display, running certain applications, which requires change of configuration, and other events. If display controller 843 determines that no display configuration changed, the process proceeds to block 1203. If display controller 843 determines that display configuration of one or more external non-embedded display changed that requires change in clock frequency of the display engine clock, the process proceeds to block 1206.

At block 1206, display control logic 1103 generates a control signal that instructs Display PLL 1101 to adjust the frequency of the display engine clock. In some embodiments, a divide-by-2 circuitry of display PLL 1101 changes the display clock frequency. In various embodiments, the change in display clock frequency is carried out without disabling Display PLL 1101. As such, there are no dead clocks and therefore no loss of audio or no display blanking or tearing affect to displays 1106. In some embodiments, in addition to or instead of changing the frequency of the display engine clock, the power supply voltage VCC is modified as indicated by block 1207. For example, VCC is modified to meet the higher frequency operation or is reduced to lower the power consumption corresponding to low frequency operation. The process then flows to block 1203.

In various embodiments, display engine 843 (or another other suitable logic or software) generates the control signal that causes the display engine clock (CDCLK) frequency to be the highest common frequency for any of the external displays. For example, if one display requires 652.8 MHz, another display requires 326.4 MHz, then display engine 843 (or another other suitable logic or software) generates the control signal that causes the display engine clock (CDCLK) to be 652.8 MHz, which is the higher of the two.

Figure 13:
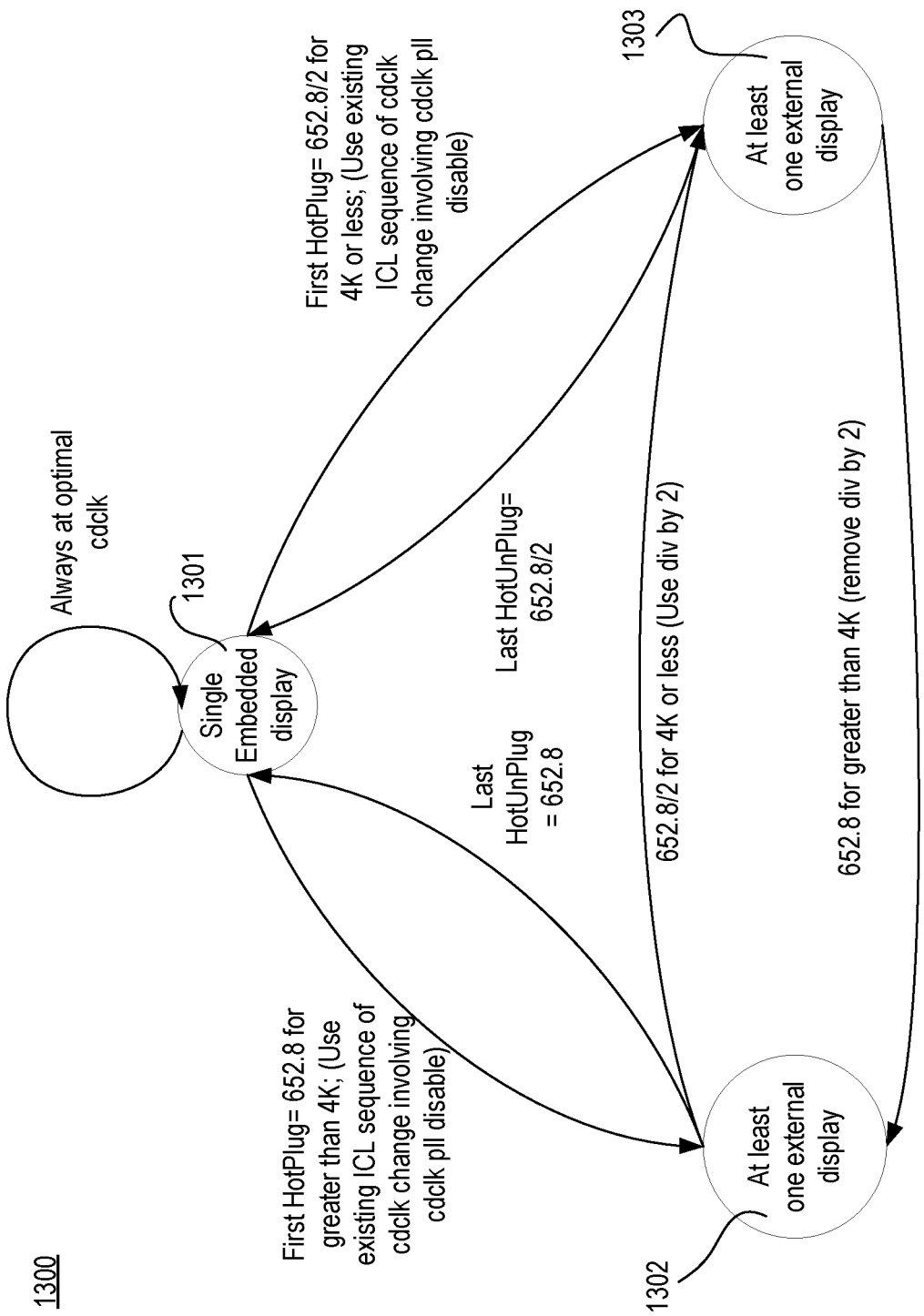
FIG. 13 illustrates a flowchart of a state diagram showing dynamic frequency adjustment of clock of the display engine (or controller) due to change in configuration of an external display, in accordance with some embodiments.

FIG. 13 illustrates flowchart 1300 of a state diagram showing dynamic frequency adjustment of clock of the display engine (or controller) due to change in configuration of an external display, in accordance with some embodiments. Flowchart 1300 shows the display engine clock (CDCLK) frequency transition flow based on external display configuration/resolution. For single embedded display configuration, the CDCLK frequency is maintained at an optimal frequency by PLL 1101 through existing display engine clock frequency sequences, which may involve performing steps during vertical blanking period and disabling-enabling of PLL 1101. State 1301 illustrates the single embedded display case. In some embodiments, after system powers on, display is setup as per enumeration and discovery of connected and enabled devices during the boot flow.

If external display configuration changes, frequency of core display clock (CDCLK) changes. For example, through first external display connection, which is detected through hot plug interrupt, and which requires servicing the first external display through changing of CDCLK frequency of display engine to either maximum CDCLK frequency or divide-by-2 of the maximum CDCLK frequency, then embedded internal display associated with the active port, pipe, and CDCLK PLL are tuned off. For example, frequency of CDCLK is set either to maximum CDCLK frequency or to divide-by-2 of the maximum CDCLK frequency based on whether an overall display configuration is below 4K or above 4K.

Audio may not be associated with the embedded display and therefore may not be lost. In some embodiments, with disabling and enabling of the PLL during vertical blanking or during induced Panel Self Refresh (PSR) state, internal embedded display blanks out and is eliminated (or substantially eliminated) because of this turning off. CDCLK PLL is reprogrammed to a desired new frequency, relocked and the rest of the intended hardware (e.g., pipe, port) is turned back on with appropriate programming changes on them, if necessary, and the system operation continues with the first external display connection hot plug.

Upon hot plug of at least 1 external display, greater than 4K resolution (e.g., 5K, 6K, or 8K, and so on), PLL 1101 changes the CDCLK frequency to a maximum (e.g., 652.8 MHz). Arrow from state 1301 to state 1302 illustrates this case.

For any subsequent change of external display(s) overall resolution or configuration to drop below 4K, PLL 1101 changes CDCLK frequency to half of the previous frequency (e.g., 652.8/2=326.4 MHz) through a divide-by-2 circuitry without disabling PLL 1101. As such, loss of audio and visual blanking/tearing artifacts are avoided. Arrow from state 1302 to state 1303 illustrates this case.

If the overall display resolution configuration changes to more than 4K at any time through third or fourth external display addition then divide-by-2 is bypassed to change frequency to 652.8 MHz without disabling PLL 1101. As such, loss of audio and video artifacts is avoided. Arrow from state 1303 to 1302 illustrates this case.

Upon hot unplug of last external non-embedded display, PLL 1101 brings back the CDCLK frequency to even more optimal frequency points (e.g., sub 326.4 MHz). For cases with first external hot plug being under 4K resolution, the CDCLK frequency is initiated with divide-by-2 itself to begin with as depicted on the right branch of the flow chart. Arrow from state 1301 to 1303 illustrates this case. Connecting or adding any subsequent external display after the first external display (e.g., third, fourth, etc. external displays) CDCLK frequency depends on whether the overall display system configuration is 4K, under 4K, or above 4K. For example, CDCLK frequency may be either divide-by-2 or not use divide-by-2 depending on the display configuration. In this case, when CDCLK frequency of display engine changes to either maximum CDCLK frequency or divide-by-2 of the maximum CDCLK frequency, then embedded internal display associated with the active port, pipe, and CDCLK PLL are tuned off.

Figure 14:
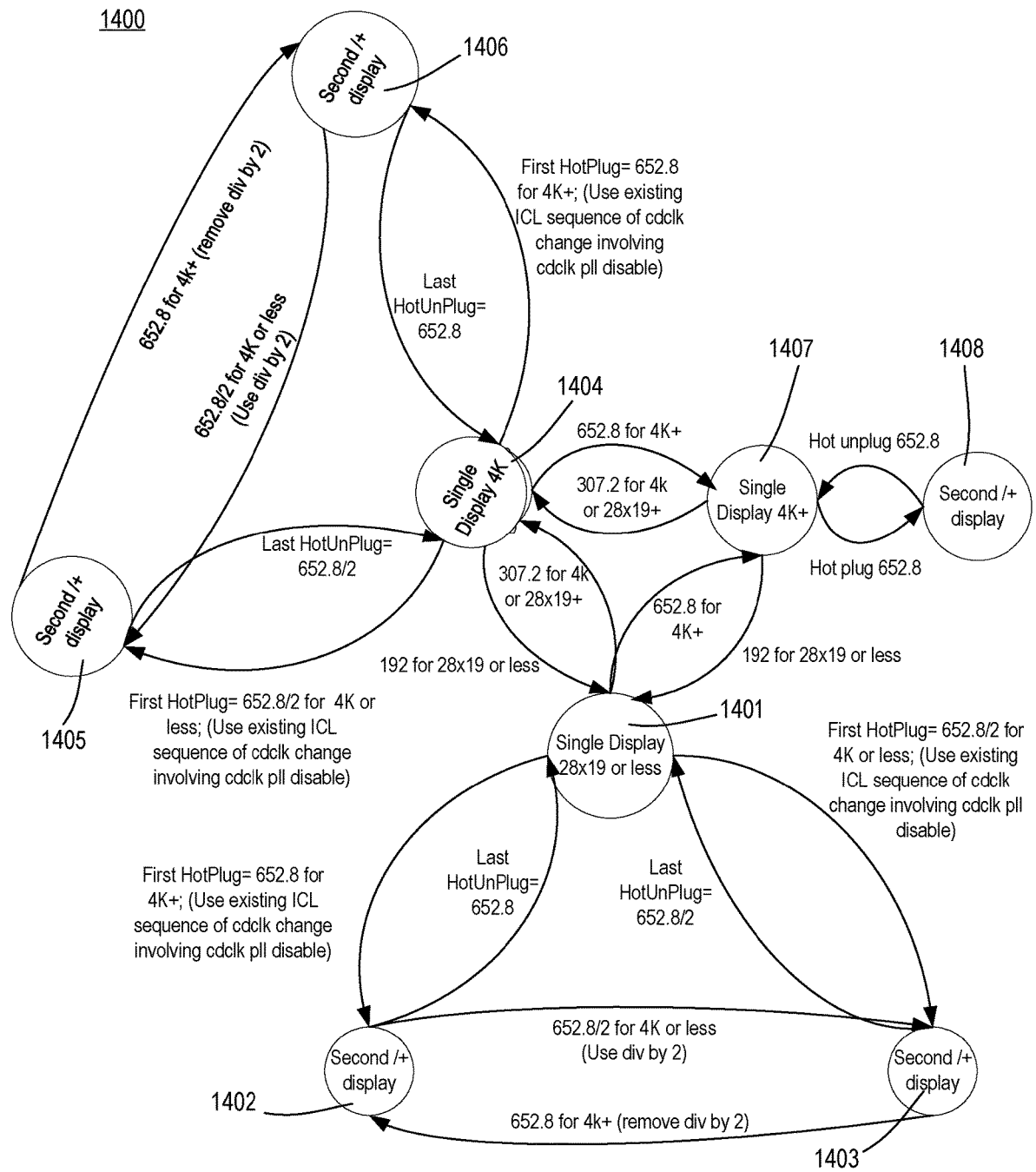
FIG. 14 illustrates a flowchart of a state diagram showing dynamic frequency adjustment of clock of the display engine (or controller) due to change in configuration of an external display, in accordance with some embodiments.

FIG. 14 illustrates flowchart 1400 of a state diagram showing dynamic frequency adjustment of clock of the display engine (or controller) due to change in configuration of an external display, in accordance with some embodiments. Flowchart 1400 depicts the expanded sample view of flowchart 1300 for CDCLK frequency transitions for various internal and external display configuration combinations. Here, 192 MHz CDCLK is used for 28×19 resolution or less, 307.2 MHz CDCLK is used for 4K or less resolution displays and 28×19 or higher resolution (e.g., between 4K and 28×19), 652.8 MHz CDCLK is used for 4K+ resolution displays (e.g. 5K or 8K resolution displays). In this example, divide-by-2 frequency for 4K or less is 364.4 MHz, which is divide-by-2 frequency of the maximum CDCLK frequency of 652.8 MHz. Arrow from state 1401 to state 1402 illustrates this case.

In the case of single display of 28×19 or less, as illustrated by state 1401, control is generated that causes PLL 1101 generates 192 MHz CDCLK. In some embodiments, 192 MHz CDCLK frequency is generated by an additional divider. Upon first hot plug of an external display which different resolution or configuration (e.g., greater than 4K resolution) than the resolution of embedded display (e.g., 28×19 or less), control signal is generated that causes PLL 1101 to generate 652.8 MHz for display engine clock. If the first hot plug of external display is 4K or below, then PLL 1101 generates 652.8 MHz with divide-by-2 function applied to make effective operating clock frequency of 326.4 MHz. Upon subsequent display hot plug (e.g., third, or fourth display), if the overall display configuration is all the system drops to 4K or less resolution then PLL 1101 generates 652.8/2 MHz CDCLK. Here, whether to use divide-by-2 function on the PLL clock depends on the overall system display configuration being either 4K or less, or above 4K. Arrow from state 1402 to state 1403 illustrates this case.

In the case of single display of 4K resolution, as illustrated by state 1404, upon first hot plug of a second display of 4K resolution or less, PLL 1101 generates 652.8/2 MHz CDCLK. Arrow from state 1404 to state 1405 illustrates this case. In the case of single display of 4K resolution, as illustrated by state 1404, upon first hot plug of a second display of greater than 4K resolution, PLL 1101 generates 652.8 MHz CDCLK. Arrow from state 1404 to state 1406 illustrates this case. In the case of subsequent third of fourth display connection, if the overall system display configuration drops to 4K or below then divide-by-2 function is used where frequency of CDCLK is divided down by two. If the overall system display configuration rises above 4K then divide-by-two function is removed to operate CDCLK at maximum frequency of 652.8 MHZ.

In the case of single display of greater than 4K resolution, hot plug of an additional display causes PLL 1101 to keep the existing 652.8 MHz CDCLK. Arrow from state 1407 to 1408 illustrates this case. The same frequency for CDCLK is used when the additional display is unplugged. In the various cases described herein, the overall display configuration of a system includes the external display as well as the embedded display.

In various embodiments, the flowcharts of FIGS. 12-14 can be implemented by firmware, software, graphics display engine/controller, or a combination of them.

Elements of embodiments (e.g., flowcharts of FIGS. 12-14) are also provided as a machine-readable medium (e.g., memory) for storing the computer-executable instructions (e.g., instructions to implement any other processes discussed herein). In some embodiments, a computing platform comprises memory, processor, machine-readable storage media (also referred to as tangible machine-readable medium), communication interface (e.g., wireless or wired interface), and network bus coupled as shown.

In some embodiments, the processor is a Digital Signal Processor (DSP), an Application Specific Integrated Circuit (ASIC), a general purpose Central Processing Unit (CPU), or a low power logic implementing a simple finite state machine to perform the method of flowcharts of FIGS. 12-14.

In some embodiments, the various logic blocks of the computer system are coupled together via a network bus. Any suitable protocol may be used to implement the network bus. In some embodiments, machine-readable storage medium includes Instructions (also referred to as the program software code/instructions) for calculating or measuring distance and relative orientation of a device with reference to another device as described with reference to various embodiments and flowcharts of FIGS. 12-14.

Program software code/instructions associated with flowcharts of FIGS. 12-14 (and/or various embodiments) and executed to implement embodiments of the disclosed subject matter may be implemented as part of an operating system or a specific application, component, program, object, module, routine, or other sequence of instructions or organization of sequences of instructions referred to as "program software code/instructions," "operating system program software code/instructions," "application program software code/instructions," or simply "software" or firmware embedded in processor. In some embodiments, the program software code/instructions associated with flowcharts of FIGS. 12-14 (and/or various embodiments) are executed by the computer system.

In some embodiments, the program software code/instructions associated with flowcharts of FIGS. 12-14 (and/or various embodiments) are stored in a computer executable storage medium and executed by the processor. Here, the computer executable storage medium is a tangible machine readable medium that can be used to store program software code/instructions and data that, when executed by a computing device, causes one or more processors to perform a method(s) as may be recited in one or more accompanying claims directed to the disclosed subject matter.

The tangible machine-readable medium may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer-to-peer networks and the like, including the Internet. Different portions of the software program code/instructions and data can be obtained at different times and in different communication sessions or in the same communication session.

The software program code/instructions (associated with flowcharts of FIGS. 12-14 and other embodiments) and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine-readable medium in entirety at a particular instance of time.

Examples of the tangible computer-readable media include but are not limited to recordable and non-recordable type media such as volatile and non-volatile memory devices, read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs), etc.), among others. The software program code/instructions may be temporarily stored in digital tangible communication links while implementing electrical, optical, acoustical or other forms of propagating signals, such as carrier waves, infrared signals, digital signals, etc. through such tangible communication links.

In general, the tangible machine readable medium includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Galaxy®, Blackberry® Droid®, or the like, or any other device including a computing device. In one embodiment, processor-based system is in a form of or included within a PDA (personal digital assistant), a cellular phone, a notebook computer, a tablet, a game console, a set top box, an embedded system, a TV (television), a personal desktop computer, etc. Alternatively, the traditional communication applications and subsidized application(s) may be used in some embodiments of the disclosed subject matter.

Figure 15:
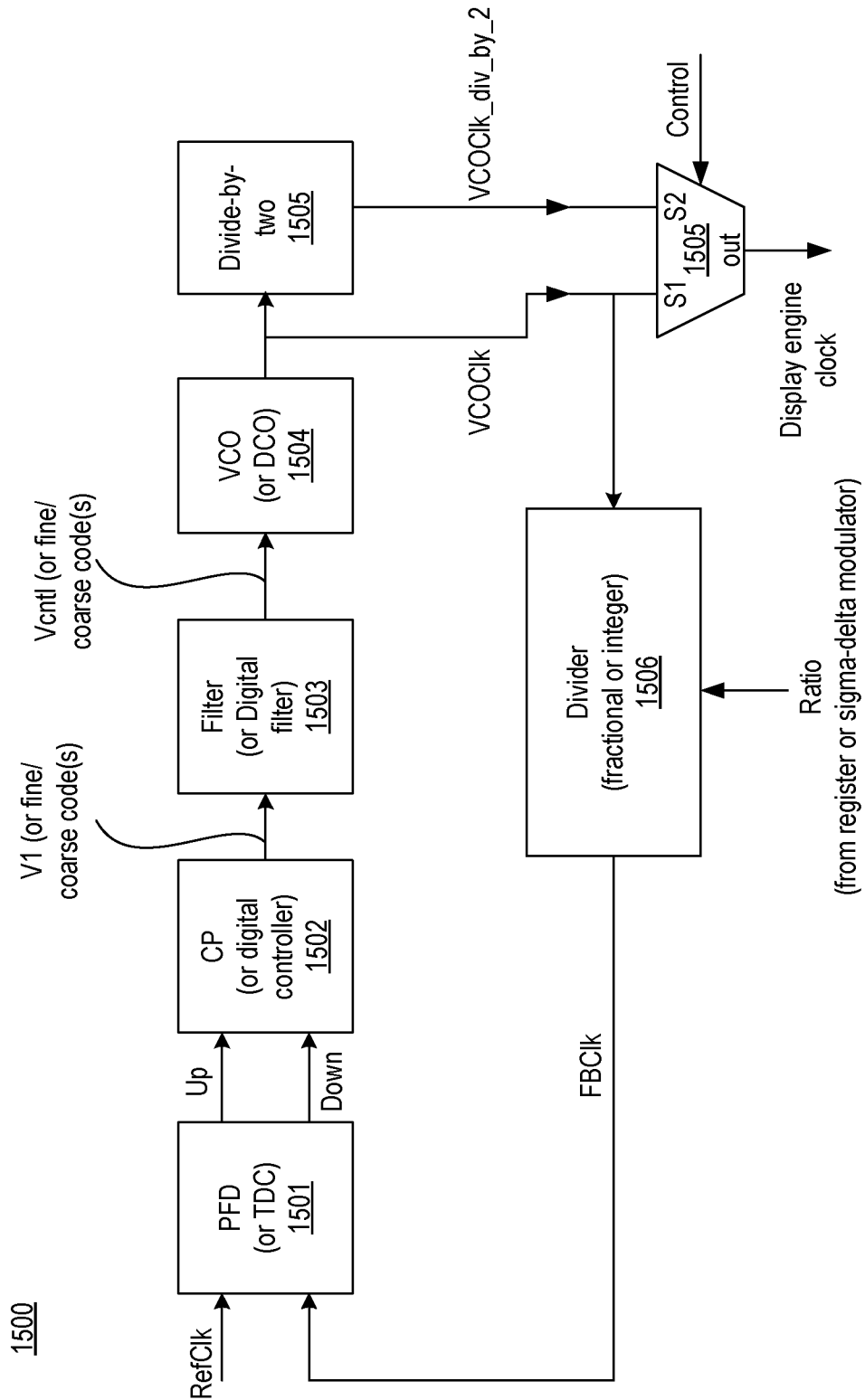
FIG. 15 illustrates a phase locked loop that provides dynamically adjustable clock for the display engine, in accordance with some embodiments.

FIG. 15 illustrates phase locked loop 1500 (e.g., PLL 1101) that provides dynamically adjustable clock for the display engine, in accordance with some embodiments. PLL 1500 can be all digital PLL, analog PLL, or mixed signal PLL. In some embodiments, PLL 1500 is an LC PLL. In some embodiments, PLL 1500 comprises a phase frequency detector (PFD) 1501, a charge pump (CP) 1502, low pass filter (LPF) 1503, voltage controlled oscillator (VCO 1504, divide-by-2 circuitry 1505, multiplexer 1505, and divider 1506.

The phase detector 1501 receives a reference clock (RefClk) and a feedback clock (FbClk) and generates Up and Down (Dn) signals that are pulses that represent the relative phase different between the RefClk and the FbClk. Charge pump 1502 receives the Up and Dn pulses and sources or sinks current on node V1. The signal on V1 is then filtered by LPF 1503 to generate a filtered control voltage Vctl. Vctl is then used to control the oscillating frequency of VCO 1504. The output of VCO 1504 is VcoClk is then divided in frequency by Divider 1506 to generate FbClk. During PLL lock, Up and Dn signals provide evidence of dynamic phase error. Dynamic phase error is the phase error between RefClk and FbClk before PLL is declared locked. A PLL is declared locked when the phase difference between RefClk and FbClk is below a predetermined threshold.

In some embodiments, phase detector 1501 use analogue techniques, while others use digital circuitry. Phase detector 1501 can be designed to be sensitive to just phase or sensitive to frequency and to phase. When phase detectors are only sensitive to phase of reference clock (RefClk) and feedback clock (FbClk), they produce an output (Up and Down) that is proportional to the phase difference between the two signals. When the phase difference between the RefClk and FbClk is steady, phase detector 1501 produces a constant voltage. When there is a frequency difference between the two signals (RefClk and FbClk), phase detector 1501 produces a varying voltage. Example implementations of phase detectors 1501 include diode ring phase detector, exclusive OR phased phase detector, JK flip-flop based comparators, and dual D-type phase detectors. Generally, when a digital phase detector is implemented, short Up and Down pulses are created by the logic gates of the digital phase detector 1501. The static phase error is the pulse width difference between Up and Down (Dn) pulses, which is caused by leakage current and the charge pump current mismatch.

In some embodiments, PFD 1501 is replaced by a time-to-digital converter (TDC). TDC can receive RefClk and FbClk and generate a stream of data indicating a difference between RefClk and TbClk. In some embodiments, CP is replaced with a digital controller that deciphers the TDC output and generate fine and/or coarse codes (e.g., digital bit-stream). In some embodiments, filter 1503 is replaced with a digital filter controlled by coefficients (programmable or fixed) to generate filtered fine or coarse codes. In some embodiments, VCO can be replaced with a digitally controlled oscillator (DCO) whose oscillation frequency is controlled by fine and/or coarse codes. In some embodiments, divider comprises a Johnson Counter. In some embodiments, divider can divide VCOClk by an integer value N or a fractional value M. The divider ration may be generated from a register or a sigma-delta modulator.

In various embodiments, the output of VCO, VCOClk, is divided by a divide-by-2 circuit 1505. Any suitable circuit can be used for divide-by-2. For example, a flip-flop with its inverted output coupled to its input can be used as a divide-by-2 circuit. The output of divide-by-2 circuit 1505 is VCOClk_div_by_2. Multiplexer 1505 receives VCOClk and VCOClk_div_by_2, and selectively provides one of the as output Display engine clock (CDCLK). Multiplexer 1505 is controlled by control signal from display control logic 1103. Depending on the resolution or configuration change of a non-embedded external display, control causes Multiplexer 1505 of PLL 1500 to select one of VCOClk or VCOClk_div_by_2 as the display engine clock. In various embodiments, when multiplexer selects a clock, the PLL remains in locked condition. A PLL is declared lock when the phase different between the RefClk and the FbClk is below a threshold. While multiplexer is shown as a 2:1 multiplexer, a larger multiplexer may be used to selectively provide a number of divided clocks (e.g., 192 MHz, 307 MHz, 326.4 MHz, 652.8 MHz) as display engine clock. In this case, control signal may be greater than 1-bit signal (e.g., 2-bit or 3-bit signal), and a divider (not shown) that can divide VCOClk into multiple possible display clock frequencies is used, wherein those multiple clocks are input to the multiplexer for selection by the control signal.

Figure 16:
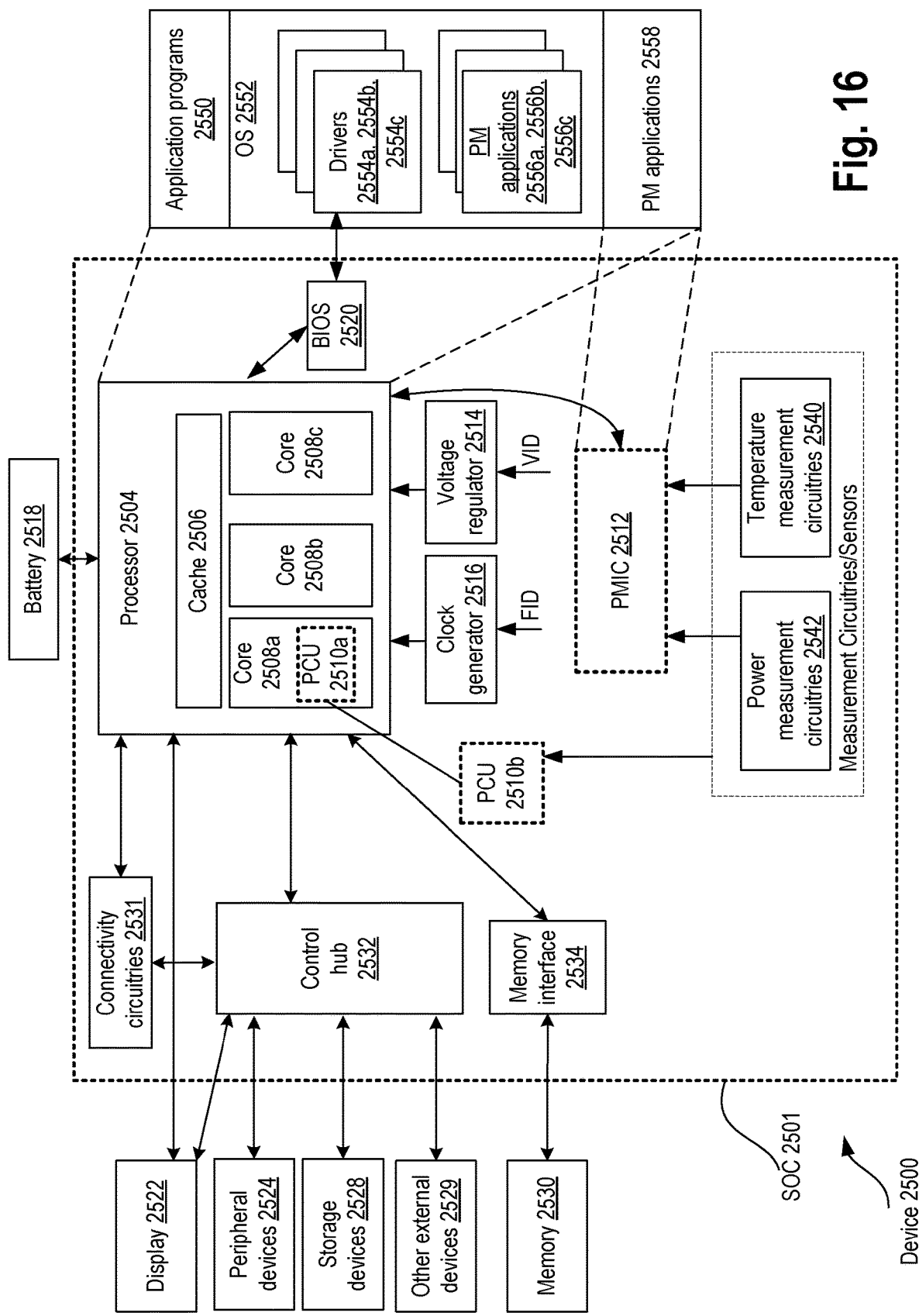
FIG. 16 illustrates a smart device, or a computer system, or a SoC (System-on-Chip) with apparatus to dynamically change display clock frequency, according to some embodiments of the disclosure.

FIG. 16 illustrates a smart device, or a computer system, or a SoC (System-on-Chip) with apparatus to dynamically change display clock frequency, according to some embodiments of the disclosure.

In some embodiments, device 2500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2500. Any components here that are concerned with graphics or display processing may include the apparatus to dynamically change the display clock frequency, in accordance with various embodiments.

In an example, the device 2500 comprises a SoC (System-on-Chip) 2501. An example boundary of the SOC 2501 is illustrated using dotted lines in FIG. 16, with some example components being illustrated to be included within SOC 2501—however, SOC 2501 may include any appropriate components of device 2500.

In some embodiments, device 2500 includes processor 2504. Processor 2504 can include one or more physical devices, such as microprocessors, application processors, microcontrollers, programmable logic devices, processing cores, or other processing means. The processing operations performed by processor 2504 include the execution of an operating platform or operating system on which applications and/or device functions are executed. The processing operations include operations related to I/O (input/output) with a human user or with other devices, operations related to power management, operations related to connecting computing device 2500 to another device, and/or the like. The processing operations may also include operations related to audio I/O and/or display I/O.

In some embodiments, processor 2504 includes multiple processing cores (also referred to as cores) 2508a, 2508b, 2508c. Although merely three cores 2508a, 2508b, 2508c are illustrated, processor 2504 may include any other appropriate number of processing cores, e.g., tens, or even hundreds of processing cores. Processor cores 2508a, 2508b, 2508c may be implemented on a single integrated circuit (IC) chip. Moreover, the chip may include one or more shared and/or private caches, buses or interconnections, graphics and/or memory controllers, or other components.

In some embodiments, processor 2504 includes cache 2506. In an example, sections of cache 2506 may be dedicated to individual cores 2508 (e.g., a first section of cache 2506 dedicated to core 2508a, a second section of cache 2506 dedicated to core 2508b, and so on). In an example, one or more sections of cache 2506 may be shared among two or more of cores 2508. Cache 2506 may be split in different levels, e.g., level 1 (L1) cache, level 2 (L2) cache, level 3 (L3) cache, etc.

In some embodiments, processor core 2504 may include a fetch unit to fetch instructions (including instructions with conditional branches) for execution by the core 2504. The instructions may be fetched from any storage devices such as the memory 2530. Processor core 2504 may also include a decode unit to decode the fetched instruction. For example, the decode unit may decode the fetched instruction into a plurality of micro-operations. Processor core 2504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2504 may be an out-of-order processor core in one embodiment. Processor core 2504 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2504 may also include a bus unit to enable communication between components of the processor core 2504 and other components via one or more buses. Processor core 2504 may also include one or more registers to store data accessed by various components of the core 2504 (such as values related to assigned app priorities and/or sub-system states (modes) association.

In some embodiments, device 2500 comprises connectivity circuitries 2531. For example, connectivity circuitries 2531 includes hardware devices (e.g., wireless and/or wired connectors and communication hardware) and/or software components (e.g., drivers, protocol stacks), e.g., to enable device 2500 to communicate with external devices. Device 2500 may be separate from the external devices, such as other computing devices, wireless access points or base stations, etc.

In an example, connectivity circuitries 2531 may include multiple different types of connectivity. To generalize, the connectivity circuitries 2531 may include cellular connectivity circuitries, wireless connectivity circuitries, etc. Cellular connectivity circuitries of connectivity circuitries 2531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2531 may include a network interface, such as a wired or wireless interface, e.g., so that a system embodiment may be incorporated into a wireless device, for example, cell phone or personal digital assistant.

In some embodiments, device 2500 comprises control hub 2532, which represents hardware devices and/or software components related to interaction with one or more I/O devices. For example, processor 2504 may communicate with one or more of display 2522, one or more peripheral devices 2524, storage devices 2528, one or more other external devices 2529, etc., via control hub 2532. Control hub 2532 may be a chipset, a Platform Control Hub (PCH), and/or the like.

For example, control hub 2532 illustrates one or more connection points for additional devices that connect to device 2500, e.g., through which a user might interact with the system. For example, devices (e.g., devices 2529) that can be attached to device 2500 include microphone devices, speaker or stereo systems, audio devices, video systems or other display devices, keyboard or keypad devices, or other I/O devices for use with specific applications such as card readers or other devices.

As mentioned above, control hub 2532 can interact with audio devices, display 2522, etc. For example, input through a microphone or other audio device can provide input or commands for one or more applications or functions of device 2500. Additionally, audio output can be provided instead of, or in addition to display output. In another example, if display 2522 includes a touch screen, display 2522 also acts as an input device, which can be at least partially managed by control hub 2532. There can also be additional buttons or switches on computing device 2500 to provide I/O functions managed by control hub 2532. In one embodiment, control hub 2532 manages devices such as accelerometers, cameras, light sensors or other environmental sensors, or other hardware that can be included in device 2500. The input can be part of direct user interaction, as well as providing environmental input to the system to influence its operations (such as filtering for noise, adjusting displays for brightness detection, applying a flash for a camera, or other features).

In some embodiments, control hub 2532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2522 represents hardware (e.g., display devices) and software (e.g., drivers) components that provide a visual and/or tactile display for a user to interact with device 2500. Display 2522 may include a display interface, a display screen, and/or hardware device used to provide a display to a user. In some embodiments, display 2522 includes a touch screen (or touch pad) device that provides both output and input to a user. In an example, display 2522 may communicate directly with the processor 2504. Display 2522 can be one or more of an internal display device, as in a mobile electronic device or a laptop device or an external display device attached via a display interface (e.g., DisplayPort, etc.). In one embodiment display 2522 can be a head mounted display (HMD) such as a stereoscopic display device for use in virtual reality (VR) applications or augmented reality (AR) applications.

In some embodiments and although not illustrated in the figure, in addition to (or instead of) processor 2504, device 2500 may include Graphics Processing Unit (GPU) comprising one or more graphics processing cores, which may control one or more aspects of displaying contents on display 2522. In various embodiment, the GPU includes the apparatus to dynamically change the display clock frequency, in accordance with various embodiments.

Control hub 2532 (or platform controller hub) may include hardware interfaces and connectors, as well as software components (e.g., drivers, protocol stacks) to make peripheral connections, e.g., to peripheral devices 2524.

It will be understood that device 2500 could both be a peripheral device to other computing devices, as well as have peripheral devices connected to it. Device 2500 may have a "docking" connector to connect to other computing devices for purposes such as managing (e.g., downloading and/or uploading, changing, synchronizing) content on device 2500. Additionally, a docking connector can allow device 2500 to connect to certain peripherals that allow computing device 2500 to control content output, for example, to audiovisual or other systems.

In addition to a proprietary docking connector or other proprietary connection hardware, device 2500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2531 may be coupled to control hub 2532, e.g., in addition to, or instead of, being coupled directly to the processor 2504. In some embodiments, display 2522 may be coupled to control hub 2532, e.g., in addition to, or instead of, being coupled directly to processor 2504.

In some embodiments, device 2500 comprises memory 2530 coupled to processor 2504 via memory interface 2534. Memory 2530 includes memory devices for storing information in device 2500. Memory can include nonvolatile (state does not change if power to the memory device is interrupted) and/or volatile (state is indeterminate if power to the memory device is interrupted) memory devices.

Memory device 2530 can be a dynamic random access memory (DRAM) device, a static random access memory (SRAM) device, flash memory device, phase-change memory device, or some other memory device having suitable performance to serve as process memory. In one embodiment, memory 2530 can operate as system memory for device 2500, to store data and instructions for use when the one or more processors 2504 executes an application or process. Memory 2530 can store application data, user data, music, photos, documents, or other data, as well as system data (whether long-term or temporary) related to the execution of the applications and functions of device 2500.

Elements of various embodiments and examples are also provided as a machine-readable medium (e.g., memory 2530) for storing the computer-executable instructions (e.g., instructions to implement any other processes discussed herein). The machine-readable medium (e.g., memory 2530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2500 comprises temperature measurement circuitries 2540, e.g., for measuring temperature of various components of device 2500. In an example, temperature measurement circuitries 2540 may be embedded, or coupled or attached to various components, whose temperature are to be measured and monitored. For example, temperature measurement circuitries 2540 may measure temperature of (or within) one or more of cores 2508a, 2508b, 2508c, voltage regulator 2514, memory 2530, a motherboard of SOC 2501, and/or any appropriate component of device 2500.

In some embodiments, device 2500 comprises power measurement circuitries 2542, e.g., for measuring power consumed by one or more components of the device 2500. In an example, in addition to, or instead of, measuring power, the power measurement circuitries 2542 may measure voltage and/or current. In an example, the power measurement circuitries 2542 may be embedded, or coupled or attached to various components, whose power, voltage, and/or current consumption are to be measured and monitored. For example, power measurement circuitries 2542 may measure power, current and/or voltage supplied by one or more voltage regulators 2514, power supplied to SOC 2501, power supplied to device 2500, power consumed by processor 2504 (or any other component) of device 2500, etc.

In some embodiments, device 2500 comprises one or more voltage regulator circuitries, generally referred to as voltage regulator (VR) 2514 VR having a high bandwidth and low power differential-to-single-ended type-III compensator. VR 2514 generates signals at appropriate voltage levels, which may be supplied to operate any appropriate components of the device 2500. Merely as an example, VR 2514 is illustrated to be supplying signals to processor 2504 of device 2500. In some embodiments, VR 2514 receives one or more Voltage Identification (VID) signals, and generates the voltage signal at an appropriate level, based on the VID signals. Various type of VRs may be utilized for the VR 2514. For example, VR 2514 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 2510a/b and/or PMIC 2512. In some embodiments, each core has a network of distributed LDOs to provide efficient control for power management. The LDOs can be digital, analog, or a combination of digital or analog LDOs.

In some embodiments, device 2500 comprises one or more clock generator circuitries, generally referred to as clock generator 2516. Clock generator 2516 generates clock signals at appropriate frequency levels, which may be supplied to any appropriate components of device 2500. Merely as an example, clock generator 2516 is illustrated to be supplying clock signals to processor 2504 of device 2500. In some embodiments, clock generator 2516 receives one or more Frequency Identification (FID) signals, and generates the clock signals at an appropriate frequency, based on the FID signals. Clock generator 2516 is an adaptive clock source that can provide an adaptive frequency output as discussed with reference to various embodiments.

In some embodiments, device 2500 comprises battery 2518 supplying power to various components of device 2500. Merely as an example, battery 2518 is illustrated to be supplying power to processor 2504. Although not illustrated in the figures, device 2500 may comprise a charging circuitry, e.g., to recharge the battery, based on Alternating Current (AC) power supply received from an AC adapter.

In some embodiments, device 2500 comprises Power Control Unit (PCU) 2510 (also referred to as Power Management Unit (PMU), Power Controller, etc.). In an example, some sections of PCU 2510 may be implemented by one or more processing cores 2508, and these sections of PCU 2510 are symbolically illustrated using a dotted box and labelled PCU 2510a. In an example, some other sections of PCU 2510 may be implemented outside the processing cores 2508, and these sections of PCU 2510 are symbolically illustrated using a dotted box and labelled as PCU 2510b. PCU 2510 may implement various power management operations for device 2500. PCU 2510 may include hardware interfaces, hardware circuitries, connectors, registers, etc., as well as software components (e.g., drivers, protocol stacks), to implement various power management operations for device 2500.

In some embodiments, device 2500 comprises Power Management Integrated Circuit (PMIC) 2512, e.g., to implement various power management operations for device 2500. In some embodiments, PMIC 2512 is a Reconfigurable Power Management ICs (RPMICs) and/or an IMVP (Intel® Mobile Voltage Positioning). In an example, the PMIC is within an IC chip separate from processor 2504. The may implement various power management operations for device 2500. PMIC 2512 may include hardware interfaces, hardware circuitries, connectors, registers, etc., as well as software components (e.g., drivers, protocol stacks), to implement various power management operations for device 2500.

In an example, device 2500 comprises one or both PCU 2510 or PMIC 2512. In an example, any one of PCU 2510 or PMIC 2512 may be absent in device 2500, and hence, these components are illustrated using dotted lines.

Various power management operations of device 2500 may be performed by PCU 2510, by PMIC 2512, or by a combination of PCU 2510 and PMIC 2512. For example, PCU 2510 and/or PMIC 2512 may select a power state (e.g., P-state) for various components of device 2500. For example, PCU 2510 and/or PMIC 2512 may select a power state (e.g., in accordance with the ACPI (Advanced Configuration and Power Interface) specification) for various components of device 2500. Merely as an example, PCU 2510 and/or PMIC 2512 may cause various components of the device 2500 to transition to a sleep state, to an active state, to an appropriate C state (e.g., C0 state, or another appropriate C state, in accordance with the ACPI specification), etc. In an example, PCU 2510 and/or PMIC 2512 may control a voltage output by VR 2514 (e.g., SCVR) and/or a frequency of a clock signal output by the clock generator, e.g., by outputting the VID signal and/or the FID signal, respectively. In an example, PCU 2510 and/or PMIC 2512 may control battery power usage, charging of battery 2518, and features related to power saving operation.

The clock generator 2516 can comprise a phase locked loop (PLL), frequency locked loop (FLL), or any suitable clock source. In some embodiments, each core of processor 2504 has its own clock source. As such, each core can operate at a frequency independent of the frequency of operation of the other core. In some embodiments, PCU 2510 and/or PMIC 2512 performs adaptive or dynamic frequency scaling or adjustment. For example, clock frequency of a processor core can be increased if the core is not operating at its maximum power consumption threshold or limit. In some embodiments, PCU 2510 and/or PMIC 2512 determines the operating condition of each core of a processor, and opportunistically adjusts frequency and/or power supply voltage of that core without the core clocking source (e.g., PLL of that core) losing lock when the PCU 2510 and/or PMIC 2512 determines that the core is operating below a target performance level. For example, if a core is drawing current from a power supply rail less than a total current allocated for that core or processor 2504, then PCU 2510 and/or PMIC 2512 can temporality increase the power draw for that core or processor 2504 (e.g., by increasing clock frequency and/or power supply voltage level) so that the core or processor 2504 can perform at higher performance level. As such, voltage and/or frequency can be increased temporality for processor 2504 without violating product reliability. In some embodiments, PMIC 2512 includes the power supply architecture that uses a linear voltage regulator as a voltage and current clamp for motherboard VRs with an active load line.

In an example, PCU 2510 and/or PMIC 2512 may perform power management operations, e.g., based at least in part on receiving measurements from power measurement circuitries 2542, temperature measurement circuitries 2540, charge level of battery 2518, and/or any other appropriate information that may be used for power management. To that end, PMIC 2512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor (s) may be directly coupled to PCU 2510 and/or PMIC 2512 in at least one embodiment to allow PCU 2510 and/or PMIC 2512 to manage processor core energy at least in part based on value(s) detected by one or more of the sensors.

Also illustrated is an example software stack of device 2500 (although not all elements of the software stack are illustrated). Merely as an example, processors 2504 may execute application programs 2550, Operating System 2552, one or more Power Management (PM) specific application programs (e.g., generically referred to as PM applications 2558), and/or the like. PM applications 2558 may also be executed by the PCU 2510 and/or PMIC 2512. OS 2552 may also include one or more PM applications 2556a, 2556b, 2556c. The OS 2552 may also include various drivers 2554a, 2554b, 2554c, etc., some of which may be specific for power management purposes. In some embodiments, device 2500 may further comprise a Basic Input/Output System (BIOS) 2520. BIOS 2520 may communicate with OS 2552 (e.g., via one or more drivers 2554), communicate with processors 2504, etc.

For example, one or more of PM applications 2558, 2556, drivers 2554, BIOS 2520, etc. may be used to implement power management specific tasks, e.g., to control voltage and/or frequency of various components of device 2500, to control wake-up state, sleep state, and/or any other appropriate power state of various components of device 2500, control battery power usage, charging of the battery 2518, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1: An apparatus comprising: a display controller to control one or more displays, including an embedded display; a phase locked loop (PLL) coupled to the display controller, wherein the PLL provides a clock with an adjustable frequency to the display controller; and logic to modify the frequency of the clock in accordance with a resolution of a non-embedded display coupled to the apparatus, wherein the PLL remains locked when the logic modifies the frequency of the clock.

Example 2: The apparatus of claim 1, wherein the logic is to modify the frequency of the clock to a highest frequency required by any of the one or more displays including the embedded and non-embedded displays.

Example 3: The apparatus of claim 1, wherein the logic is to increase the frequency of the clock when the resolution of the non-embedded display is higher than a resolution of the embedded display.

Example 4: The apparatus of claim 1, wherein the logic is to decrease the frequency of the clock when the resolution of the non-embedded display is lower than a resolution of the embedded display.

Example 5: The apparatus of claim 1, wherein the display controller is embedded in the graphics processor.

Example 6: The apparatus of claim 1 comprises a port, wherein the non-embedded display is coupled to the apparatus via the port.

Example 7: The apparatus of claim 6 comprises a display pipe coupled to the port.

Example 8: The apparatus of claim 6, wherein the port if one of: Display Port, HDMI, EDP, MIPI DSI, WIDI, WIGIG, VGA, or MHL.

Example 9: The apparatus of claim 1, wherein the logic is controllable by one of a graphic driver or firmware.

Example 10: A machine-readable storage media having machine readable instructions, that when executed, cause one or more processors to cause a machine to perform an operation comprising: controlling, via a display controller, one or more displays, including an embedded display; providing, via a phase locked loop (PLL) coupled to the display controller, a clock with an adjustable frequency to the display controller; modifying, via a logic, the frequency of the clock in accordance with a resolution of a non-embedded display coupled to the apparatus; and maintaining lock for the PLL when the logic modifies the frequency of the clock.

Example 11: The machine-readable storage media of claim 10, wherein modifying the frequency of the clock comprises setting the frequency of the clock to a highest frequency required by any of the one or more displays including the embedded and non-embedded displays.

Example 12: The machine-readable storage media of claim 10, wherein modifying the frequency of the clock comprises increasing the frequency of the clock when the resolution of the non-embedded display is higher than a resolution of the embedded display.

Example 13: The machine-readable storage media of claim 10, wherein modifying the frequency of the clock comprises decreasing the frequency of the clock when the resolution of the non-embedded display is lower than a resolution of the embedded display.

Example 14: The machine-readable storage media of claim 10, wherein the display controller is embedded in the graphics processor.

Example 15: A system comprising: a memory; a graphics processor coupled to the memory, wherein the graphics processor includes: a display controller to control one or more displays, including a first display; a phase locked loop (PLL) coupled to the display controller, wherein the PLL provides a clock with an adjustable frequency to the display controller; and logic to modify the frequency of the clock in accordance with a resolution of a second display coupled to the apparatus, wherein the PLL remains on when the logic modifies the frequency of the clock; and an antenna communicatively coupled to the graphics processor.

Example 16: The system of claim 15, wherein the first display is an embedded display, and wherein the second display is a non-embedded display.

Example 17: The system of claim 15, wherein the logic is to modify the frequency of the clock to a highest frequency required by any of the one or more displays including the embedded and non-embedded displays.

Example 18: The system of claim 15, wherein the logic is to increase the frequency of the clock when the resolution of the non-embedded display is higher than a resolution of the embedded display.

Example 19: The system of claim 15, wherein the logic is to decrease the frequency of the clock when the resolution of the non-embedded display is lower than a resolution of the embedded display.

Example 20: The system of claim 15 comprises: a port wherein the second display is coupled to the graphics processor via the display port; and a display pipe coupled to the port.

Example 21: The system of claim 15, wherein the logic is controllable by one of a graphic driver or firmware.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a display controller to control one or more displays, including an embedded display;
   a phase locked loop (PLL) coupled to the display controller, wherein the PLL provides a clock with an adjustable frequency to the display controller; and
   logic to modify the frequency of the clock in accordance with a resolution of a non-embedded display coupled to the apparatus, wherein the PLL is configured to remain locked when the logic modifies the frequency of the clock, wherein the PLL is configured to remain locked via a multiplexer which is operable to select one of a first clock or a second clock as the clock, wherein the multiplexer is not part of a feedback loop of the PLL.

2. The apparatus of claim 1, wherein the logic is to modify the frequency of the clock to a highest frequency required by any of the one or more displays including the embedded and non-embedded displays.

3. The apparatus of claim 1, wherein the logic is to increase the frequency of the clock when the resolution of the non-embedded display is higher than a resolution of the embedded display.

4. The apparatus of claim 1, wherein the logic is to decrease the frequency of the clock when the resolution of the non-embedded display is lower than a resolution of the embedded display.

5. The apparatus of claim 1, wherein the display controller is embedded in a graphics processor.

6. The apparatus of claim 1 comprises a port, wherein the non-embedded display is coupled to the apparatus via the port.

7. The apparatus of claim 6 comprises a display pipe coupled to the port.

8. The apparatus of claim 6, wherein the port is one of: Display Port, HDMI, EDP, MIN DSI, WIDI, WIGIG, VGA, or MHL.

9. The apparatus of claim 1, wherein the logic is controllable by one of a graphic driver or firmware.

10. A machine-readable storage media having machine-readable instructions, that when executed, cause one or more processors to cause a machine to perform an operation comprising:
controlling, via a display controller, one or more displays, including an embedded display;
providing, via a phase locked loop (PLL) coupled to the display controller, a clock with an adjustable frequency to the display controller;
modifying, via a logic, the frequency of the clock in accordance with a resolution of a non-embedded display; and
maintaining lock for the PLL when the logic modifies the frequency of the clock, wherein maintaining the lock for the PLL comprises selecting one of a first clock or a second clock as the clock, wherein the selecting is not part of a feedback loop of the PLL.

11. The machine-readable storage media of claim 10, wherein modifying the frequency of the clock comprises setting the frequency of the clock to a highest frequency required by any of the one or more displays including the embedded and non-embedded displays.

12. The machine-readable storage media of claim 10, wherein modifying the frequency of the clock comprises increasing the frequency of the clock when the resolution of the non-embedded display is higher than a resolution of the embedded display.

13. The machine-readable storage media of claim 10, wherein modifying the frequency of the clock comprises decreasing the frequency of the clock when the resolution of the non-embedded display is lower than a resolution of the embedded display.

14. The machine-readable storage media of claim 10, wherein the display controller is embedded in a graphics processor.

15. A system comprising:
a memory;
a graphics processor coupled to the memory, wherein the graphics processor includes:
a display controller to control one or more displays, including a first display;
a phase locked loop (PLL) coupled to the display controller, wherein the PLL provides a clock with an adjustable frequency to the display controller; and
logic to modify the frequency of the clock in accordance with a resolution of a second display communicatively coupled to the graphics processor, wherein the PLL is configured to remain locked when the logic modifies the frequency of the clock, wherein the PLL is configured to remain locked via a multiplexer which is operable to select one of a first clock or a second clock as the clock, wherein the multiplexer is not part of a feedback loop of the PLL; and
an antenna communicatively coupled to the graphics processor.

16. The system of claim 15, wherein the first display is an embedded display, and wherein the second display is a non-embedded display.

17. The system of claim 16, wherein the logic is to modify the frequency of the clock to a highest frequency required by any of the one or more displays including the embedded and non-embedded displays.

18. The system of claim 16, wherein the logic is to increase the frequency of the clock when the resolution of the non-embedded display is higher than a resolution of the embedded display.

19. The system of claim 16, wherein the logic is to decrease the frequency of the clock when the resolution of the non-embedded display is lower than a resolution of the embedded display.

20. The system of claim 15 comprises:
a port wherein the second display is coupled to the graphics processor via the port; and
a display pipe coupled to the port.

21. The system of claim 15, wherein the logic is controllable by one of a graphic driver or firmware.

* * * * *

UNITED STATES PATENT AND TRADEMARK OFFICE
CERTIFICATE OF CORRECTION

| | | |
|---|---|---|
| PATENT NO. | : 11,158,292 B2 | Page 1 of 1 |
| APPLICATION NO. | : 16/752427 | |
| DATED | : October 26, 2021 | |
| INVENTOR(S) | : Prashant Chaudhari et al. | |

It is certified that error appears in the above-identified patent and that said Letters Patent is hereby corrected as shown below:

In the Claims

Column 37
Line 17, "… MIN DSI" should read -- … MIPI DSI --

Signed and Sealed this
Twenty-eighth Day of February, 2023

Katherine Kelly Vidal
*Director of the United States Patent and Trademark Office*